(12) United States Patent
Forrest et al.

(10) Patent No.: US 10,290,816 B2
(45) Date of Patent: May 14, 2019

(54) ORGANIC ELECTROLUMINESCENT MATERIALS AND DEVICES

(71) Applicant: The Regents of the University of Michigan, Ann Arbor, MI (US)

(72) Inventors: Stephen R. Forrest, Ann Arbor, MI (US); Jaesang Lee, Ann Arbor, MI (US); Quinn Burlingame, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 15/347,371

(22) Filed: Nov. 9, 2016

(65) Prior Publication Data

US 2017/0155061 A1  Jun. 1, 2017

Related U.S. Application Data

(60) Provisional application No. 62/255,820, filed on Nov. 16, 2015, provisional application No. 62/336,821, (Continued)

(51) Int. Cl.
*H01L 51/00* (2006.01)
*C09K 11/06* (2006.01)
*H01L 51/50* (2006.01)

(52) U.S. Cl.
CPC ......... *H01L 51/0072* (2013.01); *C09K 11/06* (2013.01); *H01L 51/0061* (2013.01); *H01L 51/0074* (2013.01); *H01L 51/0085* (2013.01); *H01L 51/0087* (2013.01); *H01L 51/5004* (2013.01); *H01L 51/5028* (2013.01); (Continued)

(58) Field of Classification Search
CPC .................................................. H01L 51/0072
See application file for complete search history.

(56) References Cited

U.S. PATENT DOCUMENTS 4,769,292 A  9/1988 Tang et al.
5,247,190 A  9/1993 Friend et al.
(Continued)

FOREIGN PATENT DOCUMENTS

WO  2008057394 A1  5/2008
WO  2010011390 A2  1/2010
WO  2014163083  10/2014

OTHER PUBLICATIONS

Hopkinson, M. N., et al., "An overview of N-heterocyclic carbenes," Nature 510, 485-496 (Jun. 26, 2014).
(Continued)

*Primary Examiner* — Wael M Fahmy
*Assistant Examiner* — Sarah K Salerno
(74) *Attorney, Agent, or Firm* — Duane Morris LLP

(57) ABSTRACT

An organic light emitting device is disclosed whose emissive layer has a host material, a first emissive dopant, and a second dopant. The second dopant is an excited energy state managing dopant provided in an amount between 2-10 vol. % of the emissive layer and has a lowest triplet state energy level, $T_M$, that is higher than a lowest triplet state energy levels, $T_1$, of both the host and the first dopant and lower than the multiply-excited energy level, $T^*$, of the first dopant.

21 Claims, 21 Drawing Sheets

Related U.S. Application Data filed on May 16, 2016, provisional application No. 62/402,463, filed on Sep. 30, 2016.

(52) U.S. Cl.
CPC ............ *C09K 2211/1007* (2013.01); *C09K 2211/1014* (2013.01); *C09K 2211/1029* (2013.01); *C09K 2211/1044* (2013.01); *C09K 2211/1092* (2013.01); *C09K 2211/185* (2013.01); *H01L 51/5016* (2013.01); *H01L 51/5024* (2013.01); *H01L 51/5056* (2013.01); *H01L 51/5072* (2013.01); *H01L 51/5096* (2013.01)

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,274,980 B1 | 8/2001 | Burrows et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,475,648 B1 | 11/2002 | Hatwar et al. |
| 6,992,437 B2 | 1/2006 | Lee et al. |
| 7,279,704 B2 | 10/2007 | Walters et al. |
| 7,431,968 B1 | 10/2008 | Shtein et al. |
| 7,608,993 B2 | 10/2009 | Matsuura et al. |
| 7,846,763 B2 | 12/2010 | Bold et al. |
| 7,968,146 B2 | 6/2011 | Wagner et al. |
| 8,456,081 B2 | 6/2013 | Zhang et al. |
| 8,692,232 B2 | 4/2014 | Choi et al. |
| 9,929,365 B2 | 3/2018 | Forrest et al. |
| 2003/0230980 A1 | 12/2003 | Forrest et al. |
| 2004/0174116 A1 | 9/2004 | Lu et al. |
| 2004/0258956 A1 | 12/2004 | Matsusue |
| 2005/0046337 A1 | 3/2005 | Chin et al. |
| 2007/0275265 A1* | 11/2007 | Liu .................. H01L 51/5016 428/690 |
| 2008/0290791 A1 | 11/2008 | Lee et al. |
| 2009/0044864 A1 | 2/2009 | Thompson et al. |
| 2009/0108749 A1 | 4/2009 | Yokoyama et al. |
| 2009/0121624 A1 | 5/2009 | D'Andrade et al. |
| 2009/0189509 A1 | 7/2009 | Qiu et al. |
| 2009/0278444 A1 | 11/2009 | Forrest et al. |
| 2011/0062425 A1 | 3/2011 | Kishino et al. |
| 2011/0291082 A1 | 12/2011 | Terao et al. |
| 2012/0098002 A1* | 4/2012 | Song .................. H01L 51/5016 257/98 |
| 2012/0168737 A1* | 7/2012 | Tomono .................. C09K 11/06 257/40 |
| 2012/0206035 A1 | 8/2012 | Shitagaki et al. |
| 2013/0221332 A1 | 8/2013 | Xia et al. |
| 2013/0277653 A1 | 10/2013 | Osaka et al. |
| 2013/0292656 A1 | 11/2013 | Seo et al. |
| 2014/0364605 A1 | 12/2014 | Li et al. |
| 2015/0162552 A1* | 6/2015 | Li ..................... H01L 51/0087 546/4 |
| 2015/0280158 A1 | 10/2015 | Ogiwara et al. |
| 2015/0349286 A1* | 12/2015 | Forrest .................. C09K 11/06 252/301.16 |
| 2016/0056393 A1 | 2/2016 | Oikawa et al. |

OTHER PUBLICATIONS

Lee, J., et al., "Deep blue phosphorescent organic light-emitting diodes with very high brightness and efficiency," Nat. Mater 15, 92-98 (Jan. 2016).

Zhang, Y., et al., "Tenfold increase in the lifetime of blue phosphorescent organic light-emitting diodes," Nat. Commun. 5, Article No. 5008 (2014), pp. 1-7.

Giebink, N. C., et al. "Intrinsic luminance loss in phosphorescent small-molecule organic light emitting devices due to bimolecular annihilation reactions," J. Appl. Phys. 103, 044509 (2008).

Giebink, N. C., et al. "Direct evidence for degradation of polaron excited states in organic light emitting diodes," J. Appl. Phys. 105, 124514 (2009).

Sajoto, T., et al., "Blue and Near-UV Phosphorescence from Iridium Complexes with Cyclometalated Pyrazolyl or N-Heterocyclic Carbene Ligands," Inorg. Chem. 44, 7992-8003 (2005).

Strohriegl, P., et al., "Novel host materials for blue phosphorescent OLEDs," Proc. of SPIE vol. 8829, 882906-882906-12 (2013).

Adachi, et al., "Endothermic energy transfer: A mechanism for generating very efficient high-energy phosphorescent emission in organic materials", Appl. Phys. Letters, vol. 79, No. 13, Sep. 24, 2001, 2082.

Baldo, et al., "Very high-efficiency green organic light-emitting devices based on electrophosphorescence", Applied Physics Letters, vol. 75, No. 1, pp. 4-6, Jul. 5, 1999.

Kawamura, Y. et al., "Energy transfer in polymer electrophosphorescent light emitting devices with single and multiple doped luminescent layers" Journal of Applied Physics, vol. 92, iss. No. 1, p. 87-93.

Chang, Y.L. et al., "Enhancing the efficiency of simplified red phosphorescent organic light emitting diodes by exciton harvesting" Organic Electronics 13 (2012) 925-931.

Su, Zisheng et al., "Enhanced efficiency in mixed host red electrophosphorescence devices" Thin Solid Films 519 (2011) 5634-5637.

Chenais, Sebastien et al., "Recent advances in solid-state organic layers" Polym. Int. 2012, 61: 390-406.

Fleetham, Tyler et al., "Efficient "Pure" Blue OLEDs Employing Tetradentate Pt Complexes with a Narrow Spectral Bandwidth" Adv. Mater. 2014, 26, 7116-7121.

Park, Min Su et al., "Fused indole derivatives as high triplet energy hole transport materials for deep blue phosphorescent organic light-emitting diodes" J. Mater. Chem., 2012, 22, 3099-3104.

European Search Opinion dated Apr. 18, 2017 for corresponding European Patent Application No. 16199218.5.

Dias et al., "Triplet Harvesting with 100% Efficiency by Way of Thermally Activated Delayed Fluorescence in Charge Transfer OLED Emitters" Adv. Mater. 2013, vol. 25, Issue 27, pp. 3707-3714.

Baldo, et al., "Highly efficient phosphorescent emission from organic electroluminescent devices", Nature, vol. 395, pp. 151-154, 1998.

D'Andrade et al., "Efficient Organic Electrophosphorescent White-Light-Emitting Device with a Triple Doped Emissive Layer", Adv. Mater. 2004, vol. 16, Issue 7, Apr. 5, 2004, pp. 624-628.

Kanno, et al., "White Stacked Electrophosphorescent Organic Light-Emitting Devices Employing MoO3 as a Charge-Generation Layer", Adv. Mater. 2006, vol. 18, Issue 3, pp. 339-342.

Levermore, et al., "Phosphorescent organic light-emitting diodes for high-efficacy long-lifetime solid-state lighting", J. of Photonics for Energy, 2012, vol. 2, Issue 1, Feb. 12, 2005.

Shen, et al., "Three-Color, Tunable, Organic Light-Emitting Devices" Science, 1997, vol. 276, Issue 5321, pp. 2009-2011.

Wang, et al., "Photodegradation of small-molecule organic photovoltics", Solar Energy Materials & Solar Cells, 2014, vol. 125, pp. 170-175.

\* cited by examiner

ORGANIC ELECTROLUMINESCENT MATERIALS AND DEVICES

CROSS-REFERENCE TO RELATED APPLICATIONS

This application claims priority to U.S. Provisional Application Nos. 62/255,820, filed Nov. 16, 2015; 62/336,821, filed May 16, 2016; and 62/402,463, filed Sep. 30, 2016, the entire contents of which are incorporated herein by reference.

GOVERNMENT RIGHTS

This invention was made with government support under Contract No. DOE DE-EE0007077 awarded by the Department of Energy and Contract No. FA9550-14-1-0245 awarded by the United States Air Force. The government has certain rights in the invention.

PARTIES TO A JOINT RESEARCH AGREEMENT

The claimed invention was made by, on behalf of, and/or in connection with one or more of the following parties to a joint university corporation research agreement: The Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD

The present invention relates to organic light emitting devices (OLEDs) and, more specifically, to arrangements and techniques that provide relatively high performance and lifetime to various types and components of OLEDs.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted Ir(ppy)$_3$, which has the following structure:

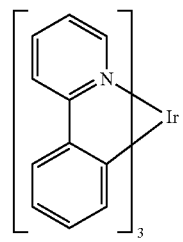

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

We introduce a model that accurately describes the degradation pathway and the effects of an excited energy state manager dopant in extending device lifetime, particularly for devices that emit in wavelengths less than or equal to 500 nm. The excited energy state managers can be effective in both metalorganic phosphorescent and thermally activated delayed fluorescent blue OLEDs.

According to some embodiments, an organic light emitting device is disclosed which comprises: an anode; a cathode; and an organic layer, disposed between the anode and the cathode, comprising a emissive layer, wherein the emissive layer comprises a host material, a first dopant, and a second dopant. The first dopant is an emissive dopant. The second dopant is an excited energy state managing dopant. The second dopant comprises between 2-10 vol. % of the emissive layer, and has a lowest triplet state energy level, $T_M$, that is higher than a lowest triplet state energy levels, $T_1$, of both the host and the first dopant and lower than the multiply-excited energy level, $T^*$, of the first dopant.

According to yet another embodiment, the OLED can be incorporated into one or more of a consumer product, an electronic component module, and/or a lighting panel.

BRIEF DESCRIPTION OF THE DRAWINGS

FIG. 13B shows the model fit to the time evolution of the luminance degredation data and FIG. 13C shows the model fit to the operational voltage rise data.

FIG. 13D shows model fit to the time evolution of the luminance degradation data and FIG. 13E shows the model fit to the operational voltage rise data.

FIG. 13H shows model fit to the time evolution of the luminance degradation data and FIG. 13I shows the model fit to the operational voltage rise data

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
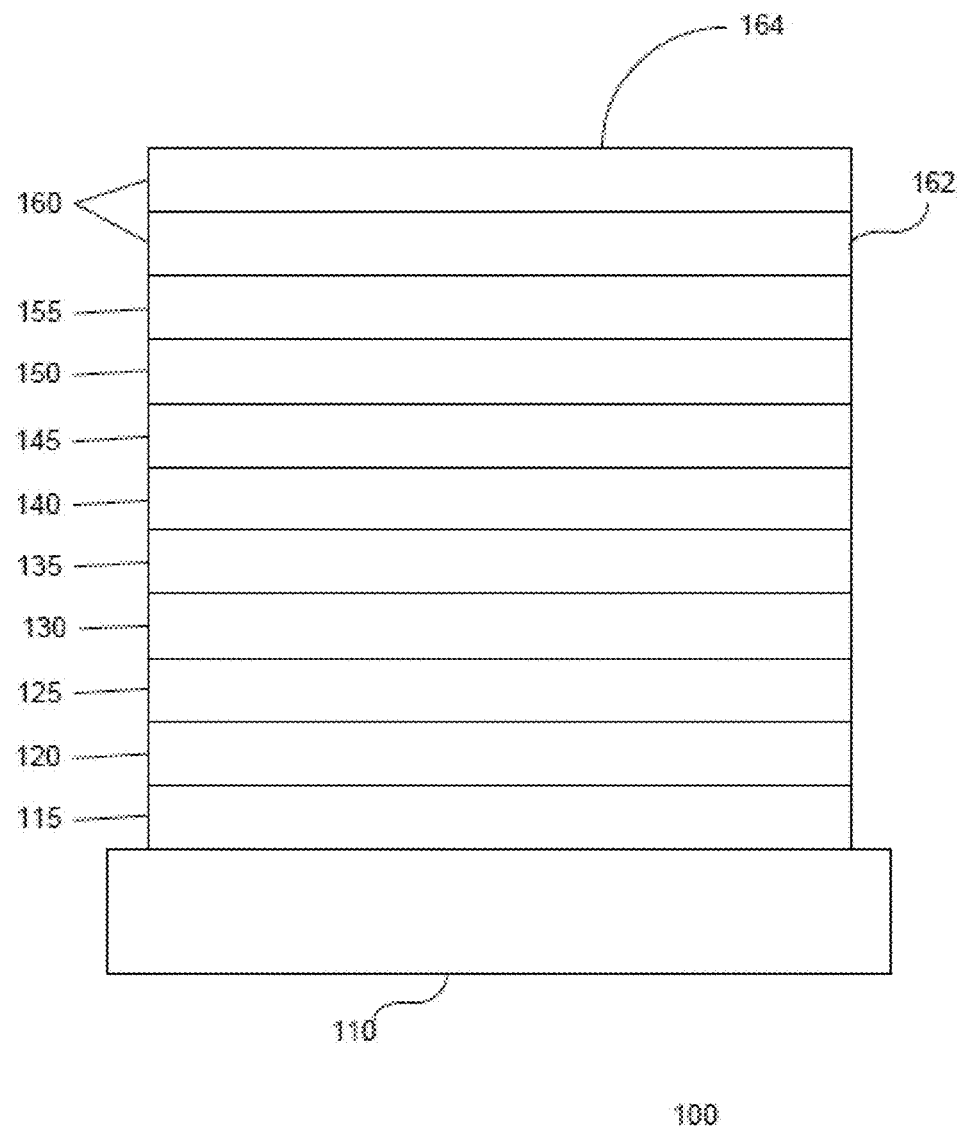
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
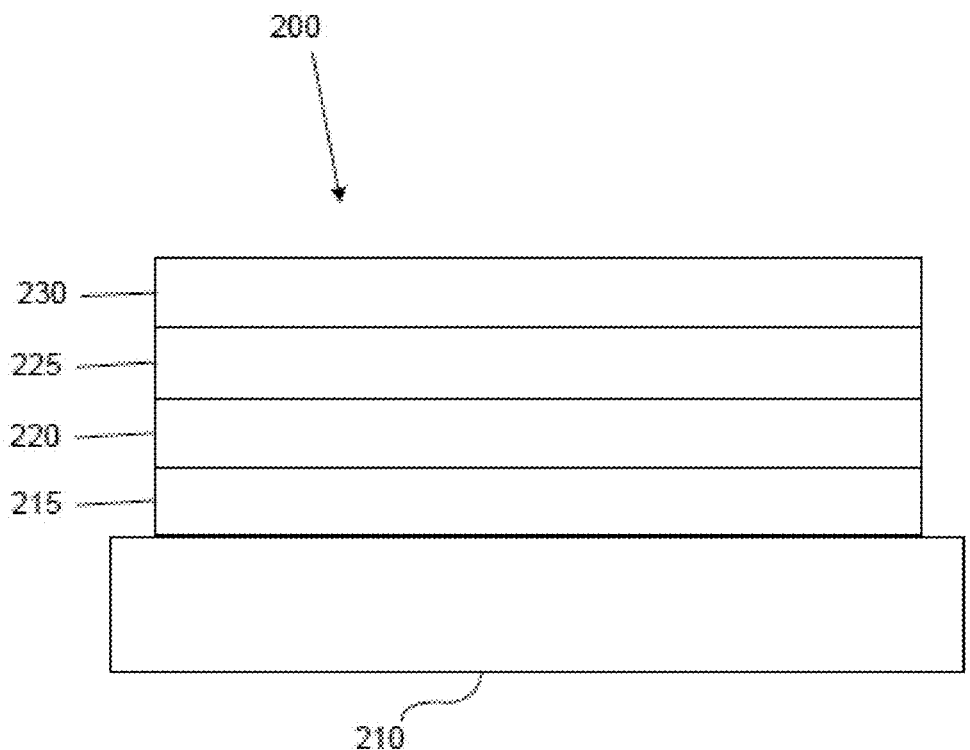
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable device, laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Generally, different types, arrangements, and colors of OLEDs may have dramatically different operational lifetimes. For example, blue phosphorescent OLEDs (PHOLEDs) often have a relatively short operational lifetime and remains insufficient for their use in displays and lighting, impeding the progress of large-scale commercialization of OLED technology.

Blue emission comprises about 15-25% of the emission in white OLEDs (WOLEDs) depending on the WOLED color coordinates and the color temperature of the lighting. Since the blue PHOLED lifetime typically is far shorter than that of red and green PHOLEDs, the short lifetime of blue PHOLEDs presents the primary limitation for using blue PHOLEDs in WOLED applications.

Red and green OLEDs are almost universally based on electrophosphorescent emission due to the ability to achieve 100% internal quantum efficiency (IQE) and operational lifetimes of T95 greater than 10,000 hours which is sufficient for most display and lighting applications. Here, T95 refers to the elapsed time for the luminance to decrease to 95% of its initial value of $L_0=1,000$ cd/m$^2$ under a constant current operation.

The short lifetime of blue PHOLEDs has led to the use of significantly less efficient fluorescent OLEDs for the blue-emitting component. Nevertheless, even the lifetime of blue fluorescent OLEDs is insufficient for many demanding applications and are at least ten times less than state-of-the art red and green PHOLEDs. In the same vein, the lifetime of green thermally activated delayed fluorescent (TADF) OLEDs is only T95=1,300 hours, and considerably less for blue.

The relatively short operational lifetime of blue PHOLEDs has been attributed to annihilation between excited states (i.e. exciton-exciton or exciton-polaron) in the device emission layer (EML) resulting in an Auger recombination that produces energetically "hot" (i.e. multiply excited) triplet state that lead to molecular dissociation. The hot state can attain up to double the energy of the initial excited state (up to ≳6.0 eV) and there is an increased possibility that dissipation of its energy on the blue dopant or the host molecules can induce chemical bond dissociation in the blue dopant or the host molecules. The probability of this reaction increases with the excited state energy, and hence this degradation mechanism is particularly dominant for blue PHOLEDs, compared to their red and green-emitting analogs. The dissociated products increase in number with time forming non-radiative defects and permanently reduce the efficiency of the PHOLEDs.

Particularly, excitons on the phosphor can encounter free electrons (i.e. "electron-polarons") or excitons on the host molecules, resulting in an instantaneous doubling of the polaron (or exciton) energy as shown, for example, in FIGS. 3A-3B. FIGS. 3A-3B show two mechanisms resulting in PHOLED failure via the dissociation of molecular species into non-emissive and permanent trap states, R (dashed line)—exciton polaron, i.e. charge, as shown in FIG. 3A, and exciton-exciton annihilation, as shown in FIG. 3B. Solid lines correspond to the molecular ground (S0) and excited states (singlet S0, triplet T1). Horizontal dashed lines represent the molecular vibronic energies. Here, Δr represents the average of atomic distances within the molecule, and E the energy. The lowest E(Δr) corresponds to the equilibrium state.

If concentrated onto a single molecular bond on the host, the excess energy can lead to molecular decomposition, or fragmentation, creating the non-radiative trap. This is a fundamental energy-driven process. It is expected the highest energy (blue) excitons lead to the highest energy polarons with the greatest probability for breaking bonds. This is precisely what is observed: blue PHOLEDs typically have orders of magnitude shorter lifetimes compared with green and red. This ultimately determines the lifetime of white PHOLEDs that may need to emit approximately 25% of their light in the blue to generate certain types of white color.

The inventors have discovered that by managing the hot triplet states to prevent molecular dissociation, the operational life of high energy emission PHOLEDs such as blue PHOLEDs can be substantially increased. This can be accomplished by reducing bimolecular annihilations, or by "bypassing" the dissociative processes altogether. Reduction of bimolecular annihilation has recently been demonstrated via evenly distributing excited states and polarons across the EML via dopant grading. Here we demonstrate a strategy to thermalize the hot triplet states without damaging the blue dopant or host molecules in the EML. This approach leads to a substantial improvement in the operational stability of blue PHOLEDs beyond that observed to date. For this purpose, we add an ancillary dopant called an excited state "manager" into the EML. The manager dopant is referred to as ancillary because it does not emit light. The manager has a triplet exciton energy that is intermediate between that of the lowest energy triplets of the EML molecules and the hot triplet states generated by bimolecular annihilation. By enabling the rapid exothermic energy transfer from the hot states to the manager dopant, the probability of direct dissociative reactions in the EML is reduced, leading to a significant improvement in the device lifetime.

To optimize the non-destructive de-excitation of hot triplet states, the manager dopant is preferably located in the region where the triplets have the highest density where bimolecular annihilation is most probable. Implementing this strategy, the longest-lived managed blue PHOLEDs achieve an approximately 260% and 90% increase in lifetime, reaching T80=334±5 hours at $L_0$=1,000 cd/m$^2$, compared to previously reported conventional, and state-of-the-art graded-EML devices of T80=93±9 and 173±3 hours, respectively. Inventors have developed a triplet-triplet annihilation-based model that accurately predicts the lifetime characteristics of managed PHOLEDs for several different device configurations. Based on our results, we provide selection criteria for manager dopant molecules that can enable further improvement in the stability of OLEDs that produce high energy emission, λ<500 nm, such as blue phosphorescent and TADF-based OLEDs.

Figure 3:
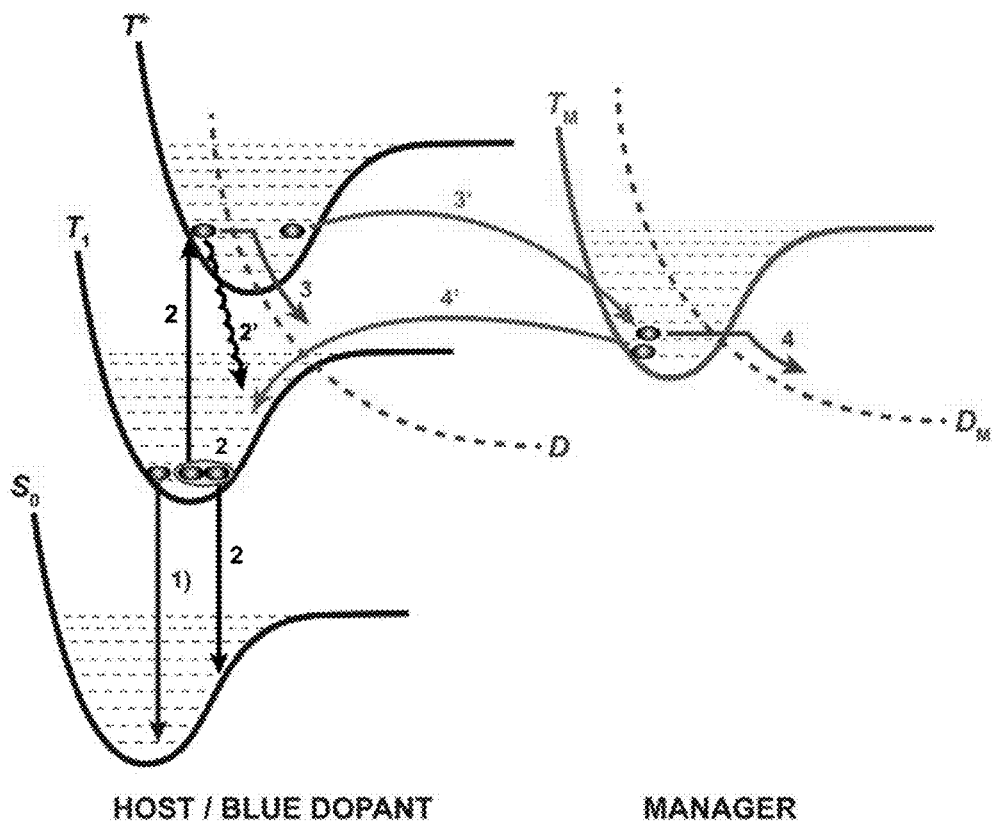
FIG. 3 shows the Jablonski diagram of an EML containing an excited state manager and the possible relaxation pathways for triplet excitons.

FIG. 3 shows the Jablonski diagram of an EML containing an excited state manager dopant and the possible relaxation pathways for triplet excitons. The diagram is a schematic illustration showing the qualitative relationship among the different energy levels between the manager dopant and the host or the emitter dopant in the EML. In other words, the $S_0$, $T_1$, and T* energy levels shown on the left side of FIG. 3 and their relationship to $T_M$ shown on the right side of FIG. 3 is applicable to both the host and the blue dopant, the emitting dopant, in the EML. $S_0$ is the ground state of the blue dopant or the host. $T_1$ is the lowest triplet state energy of the blue dopant or the host. T* is the higher-energy triplet electronic manifold of the blue dopant or the host referred to herein as the excited hot triplet state energy. D represents the dissociative reactions via predissociative potential of the EML materials. $T_M$ is the lowest triplet state energy of the manager dopant. Possible energy-transfer pathways are numbered as follow: 1) radiative recombination, 2) triplet-triplet annihilation TTA, 2)' internal conversion and vibrational relaxation, 3) and 4) dissociative reactions rupturing the molecules, 3)' and 4)' Exothermic Dexter energy transfer referred to the hot excited state management process.

While the present disclosure uses PHOLEDs as examples, this process also represents the excited state energies available in TADF devices. A similar degradation pathway is assumed to be active in both cases. The manager dopant can enable the transfer of the hot triplet state energy T* resulting from TTA, (process 2 in FIG. 4), to the lowest excited state of the manager $T_M$ via process 3'. We note that the hot triplet energy state can be either a triplet energy state resulting from TTA or a polaron state resulting from triplet-polaron annihilation TPA. As will be shown below, the system investigated here is dominated by TTA, although either or both mechanisms may be active. Furthermore, the hot triplet state energy T* can be one of many potential electronic state manifolds above the lowest, radiative triplet state energy $T_1$. However, given the extremely rapid decay rates from the higher states, it is likely that $T_2$ triplet state energy level is the most probable host state T* for inducing dissociative reactions.

Referring to FIG. 3, by introducing a manager dopant whose lowest triplet state energy level $T_M$ is greater than the lowest triplet state energy levels of both the host and the blue dopant, a transfer from T* to $T_M$ (process 3') is spin-symmetry allowed, and damage to these molecules (the host and the blue dopant) via dissociative reactions (process 3) is minimized provided that the rate for T*→$T_M$ is greater than for T*→D, where D is the dissociative state for the dopant or the host in the EML. The excited states of $T_M$ then transfer back to the blue dopant or host ($T_M$→$T_1$) via process 4' leading to radiative recombination (process 1)), or recycle back to T* by additional collisions with a neighboring triplet (or polaron) state, TTA (process 2). Processes 3' and 4' most probably occur via rapid, exothermic Dexter transfer. It is also possible that the hot triplet states to $T_M$ can result in dissociation of the manager dopant itself via $T_M$→$D_M$ (process 4), i.e. where the manager dopant serves as a sacrificial additive to the EML. Process 4 is undesirable since the number of effective managers decreases over time, providing less protection for the host and blue dopant. Nevertheless, even in this case it can still increase device stability.

As the foregoing discussion showed, an effective manager dopant has the lowest triplet state energy $T_M$ that is intermediate between that of the multiply excited state energy T* and the lowest triplet state energy $T_1$ of the host and the blue dopants. According to another aspect of the present disclosure, an effective manager dopant would be such that the rate of the energy transfer from the blue dopant to the manager T*→$T_M$ is comparable to or greater than the rate of dissociation of the blue dopant to the dissociative state, T*→D (process 3), where D is the dissociative state for the blue dopant or the host in the EML. Additionally, it would be preferable that the manager dopant be sufficiently stable material such that the degradation of the manager via dissociation reaction (process 4) does not happen sooner than the degradation of the hosts or the blue dopants (via process 3) in unmanaged devices.

EXPERIMENTAL

Inventors used N-heterocyclic carbene (NHC) Ir(III) complexes as both the blue dopant and manager. Specifically, the relatively stable blue dopant, iridium (III) tris[3-(2,6-dimethylphenyl)-7-methylimidazo[1,2-f] phenanthridine] [Ir(dmp)$_3$], and the host, 4,4'-bis[N-(1-naphthyl)-N-phenyl-amino]-biphenyl (mCBP) having $T_1$, the lowest triplet state energies of 2.7 eV and 2.8 eV, respectively. These molecules were protected by meridional-tris-(N-phenyl, N-methyl-pyridoimidazol-2-yl)iridium (III) [mer-Ir(pmp)$_3$] as the manager dopant in the EML. The molecular formulae of mer-Ir(pmp)$_3$ and Ir(dmp)$_3$ are shown below:

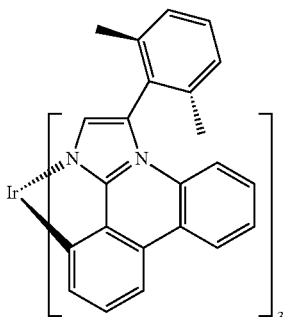

Blue Dopant Ir(dmp)$_3$

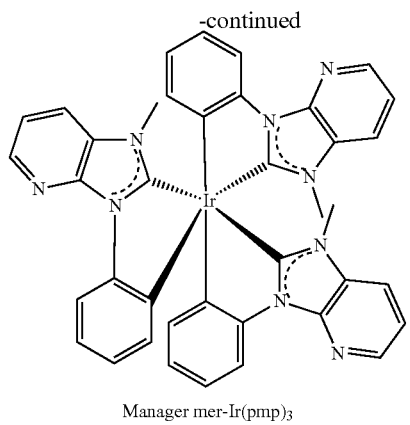

Manager mer-Ir(pmp)$_3$

The manager is characterized by a relatively strong metal-ligand bond and a high glass transition temperature Tg of 136° C. $T_M$, the lowest triplet state energy of the manager mer-Ir(pmp)$_3$ is ≈2.8 eV calculated from its peak phosphorescence spectrum (λ=454 nm), while the onset of the manager's phosphorescence spectrum starts at λ=400 nm corresponding to 3.1 eV (see FIG. 7A). Thus, mer-Ir(pmp)$_3$ meets the energy requirement of a manager dopant. As will be shown by the data described below, a significant improvement in PHOLED lifetime was observed for the managed devices in comparison to the non-managed blue PHOLEDs.

Performance of Managed PHOLEDs

Figure 4:
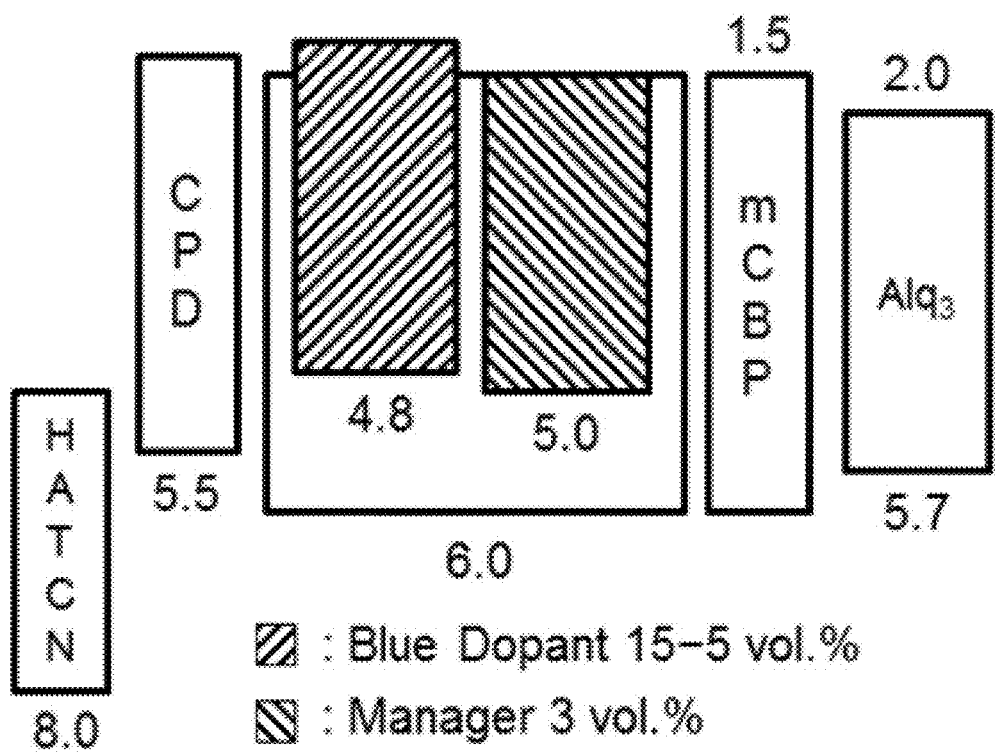
FIG. 4 shows the energy level diagram of the managed devices.
Figure 5A:
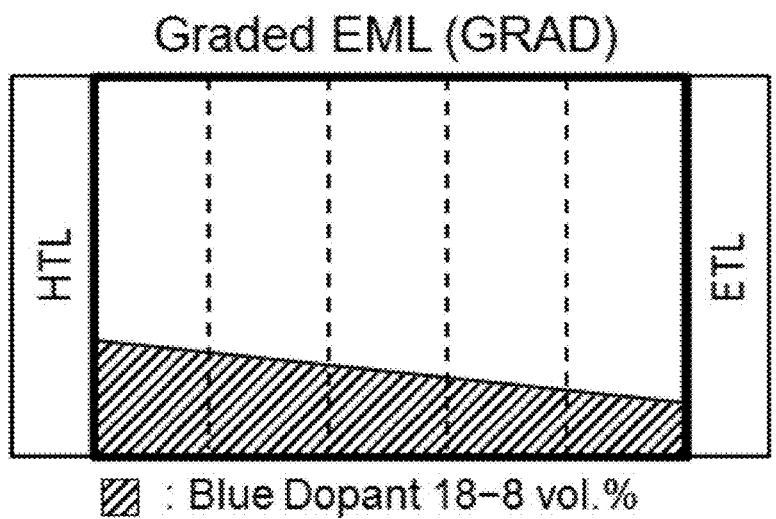
FIG. 5A shows the EML doping scheme of the graded control PHOLED device denoted as GRAD.
Figure 5B:
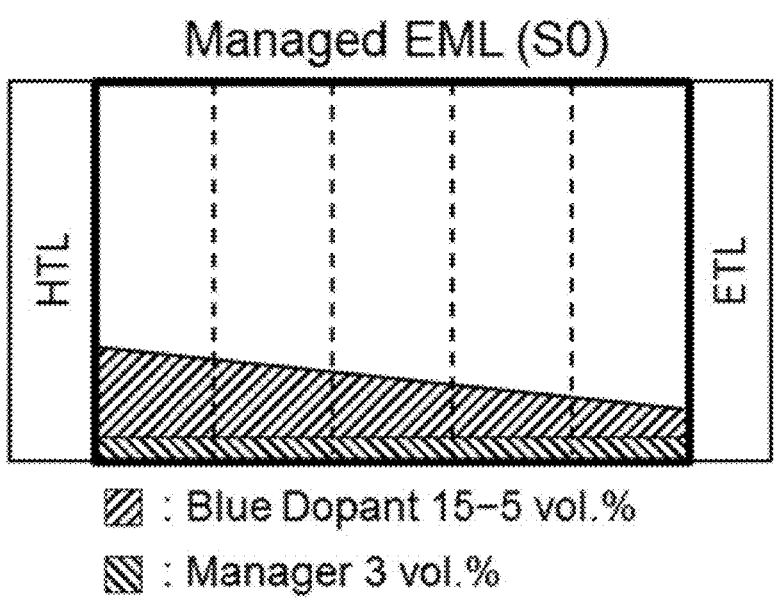
FIG. 5B shows the EML doping scheme of the graded managed PHOLED device denoted as S0.
Figure 6A:
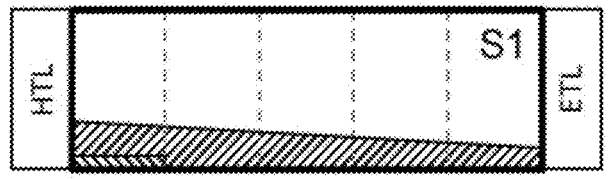
FIGS. 6A-6E illustrates the localized doping scheme of the manager material in each of the devices S1 through S5, respectively, in which the manager material is doped at 3 vol. % into 10 nm-thick zones at various positions within the 50 nm-thick EML of the devices S1 through S5.
Figure 6B:
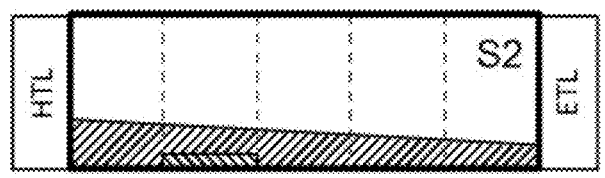
Figure 6C:
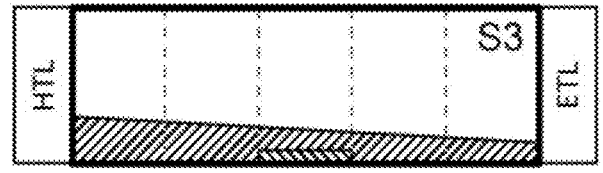
Figure 6D:
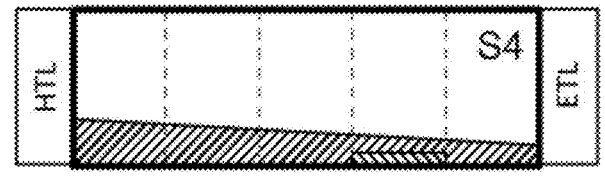
Figure 6E:
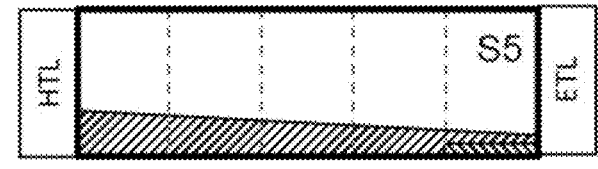

FIG. 4 shows the energy level diagram of the managed devices. The lower energy (>1 eV) of the HOMO of the blue dopant compared with that of the host suggests that hole transfer is predominantly supported by the dopant molecules and only slightly by the manager, while electrons are transported by both the host and the manager having nearly identical LUMO energies (see discussion in Supplementary Information S1 section below). The EML doping schemes of the graded control PHOLED, and managed PHOLEDs are given in FIGS. 5A and 5B (denoted as GRAD and S0, respectively; see discussion in Methods section below). For the GRAD device, the concentration of the blue dopant is linearly graded from 18 to 8 vol. % from the EML/hole transport layer (HTL) interface to the EML/electron transport layer (ETL) interface to enable a uniform distribution of excitons and polarons throughout the region. This structure has been shown in the industry to have reduced bimolecular annihilation, and thereby achieve an extended lifetime compared to conventional, non-graded EML devices (denoted as CONV; see Methods section below).

In device S0, a 3 vol. % of the manager is uniformly doped across the EML, and the concentration of the blue dopant is graded from 15 to 5 vol. % from the EML/HTL interface to the EML/ETL interface. In order to investigate the position of the manager within the EML that results in the longest operational lifetime, the manager was doped at 3 vol. % into 10 nm-thick zones at various positions within the 50 nm-thick EML of graded devices S1 through S5. The location of the 10 nm-thick zone doped with the manager in the graded devices S1 through S5 are shown in FIGS. 6A-6E, respectively. Except for the zone with the manager, the remainder of the EMLs in devices S1 through S5 are identical to that of GRAD PHOLED.

Figure 7A:
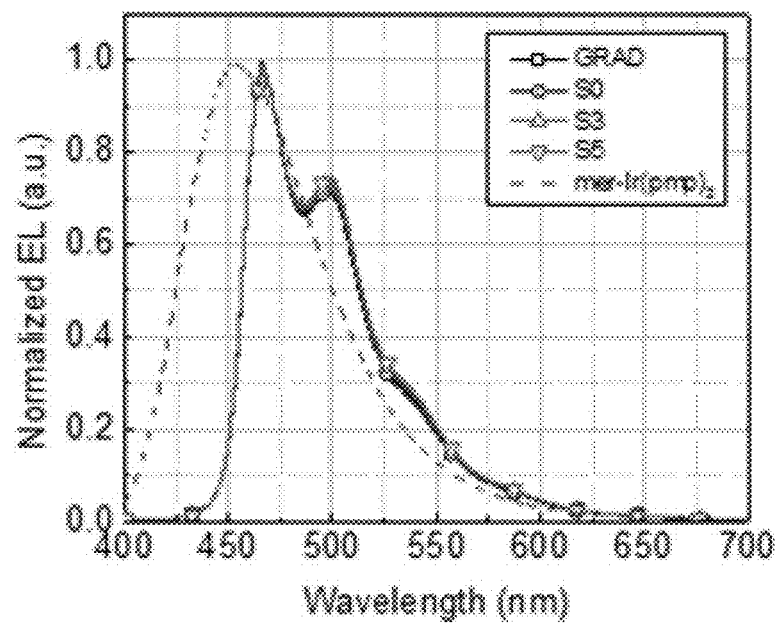
FIG. 7A shows the electroluminescence (EL) spectra of devices GRAD, S0, S3, and S5 measured at a current density of $J=5$ mA/cm$^2$.

FIG. 7A shows the electroluminescence (EL) spectra of devices GRAD, S0, S3 and S5 measured at a current density of J=5 mA/cm$^2$. The GRAD PHOLED and the managed PHOLEDs exhibit nearly identical EL spectra with Commission Internationale de l'Elcairage (CIE) chromaticity coordinates of [0.16, 0.30]. This confirms that in the managed PHOLEDs, radiative recombination occurs solely on the blue dopant without involving emission from the manager. Note that the excitons can be formed on the manager either by direct electron-hole recombination or transferred from hot triplet states via process 3' (shown in FIG. 3). Since $T_M$ the energy level of the lowest triplet state of the manager is 2.8 eV which is higher than $T_1$ the energy level of the lowest triplet state of the blue dopant which is 2.7 eV, triplets on the manager efficiently transfer back to the blue dopant via process 4' in FIG. 3.

Figure 7B:
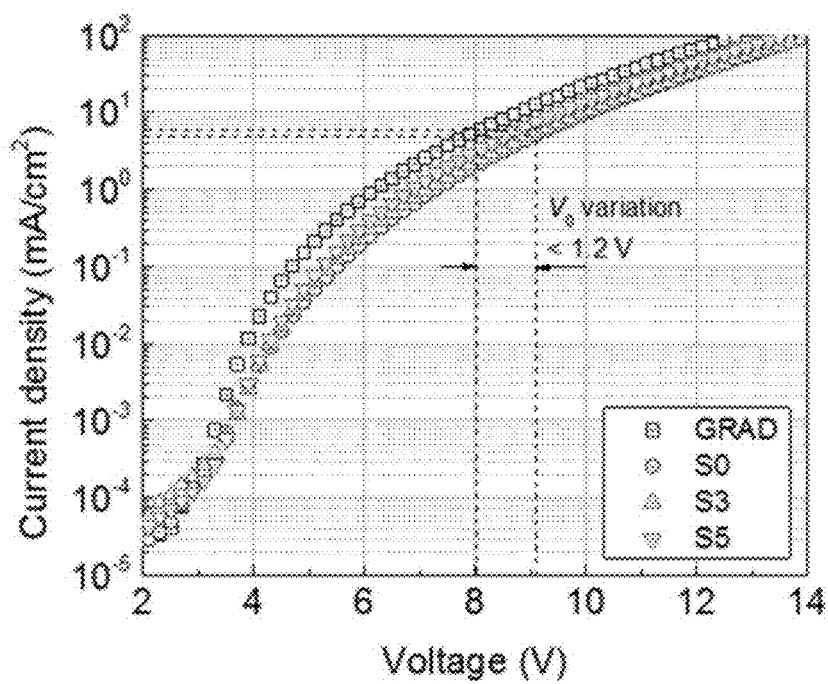
FIG. 7B shows the current density-voltage (J-V) characteristics of devices GRAD, S0, S3, and S5.
Figure 7C:
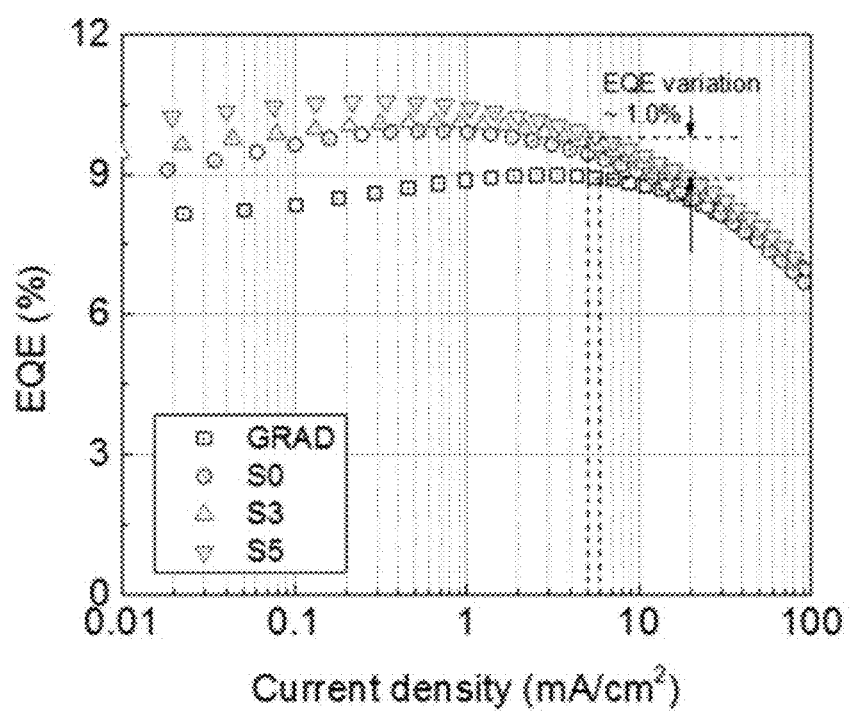
FIG. 7C shows the external quantum efficiency (EQE-J) characteristics of devices GRAD, S0, S3, and S5.

FIGS. 7B and 7C show the current density-voltage (J-V) and external quantum efficiency (EQE)-J characteristics of devices GRAD, S0, S3, and S5. Table 1 provided below summarizes properties of their EL characteristics at $L_0$=1,000 cd/m². The initial operating voltages ($V_0$) of the managed PHOLEDs S0 through S5 are higher than the GRAD device by ~1V. This is consistent with the lower hole mobility of the manager than that of the blue dopant. For example, when a small concentration (<5 vol %) of the manager is added as a substitute of the same amount for the blue dopant, the device resistance marginally increases (see Supplemental Information S1 section below). This is due to the difference in the HOMO level of the manager at 5.3±0.1 eV and the HOMO level of the blue dopant which is at 4.8±0.1 eV, creating a small energy barrier that impedes hole transport between the manager molecules. The EQE of the managed PHOLEDs at $L_0$=1000 cd/m² is slightly (<1.0%) higher than that of the GRAD device, leading to the maximum difference in driving current density of $J_0$<0.6 mA/cm² needed to achieve the same $L_0$.

in T90 and T80 of 440±120 and 260±40%, respectively. In this work, T90 and T80 are used to determine the short- and long-term effectiveness of the excited state management, indicative of its potential use in PHOLED-based display and lighting applications. Although these applications may impose slightly different requirements (e.g. T95 or T70, respectively), consistent improvement in both T90 and T80 indicates the usefulness of the manager in both applications.

The reduced lifetime improvement by the manager from T90 to T80 (e.g. 200±30% to 90±10% for S3) is attributed to the degradation of the manager molecules via process 4. However, increasing the manager concentration to greater than 3 vol. % leads to a higher operating voltage due to its lower hole mobility. The device efficiency and lifetime can be further enhanced by using manager molecules that are more stable and have higher charge transport ability than mer-Ir(pmp)$_3$.

Figure 8A:
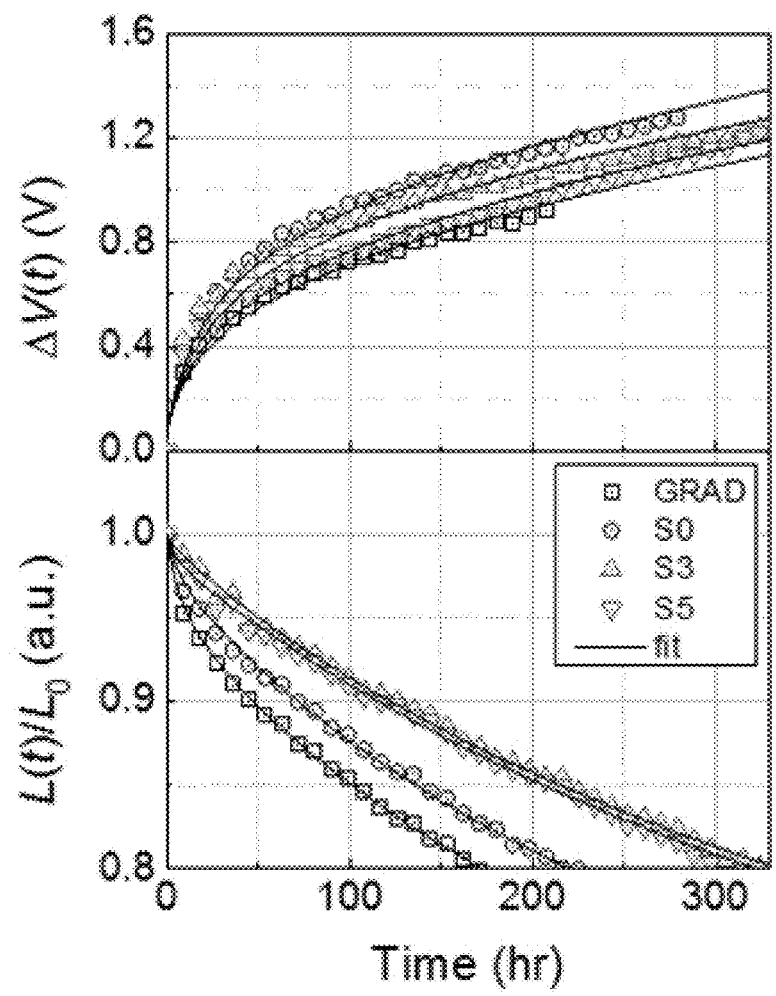
FIG. 8A shows the time evolution of the increase in operating voltage and normalized luminance loss of GRAD device and managed devices S0, S3, and S5.
Figure 8B:
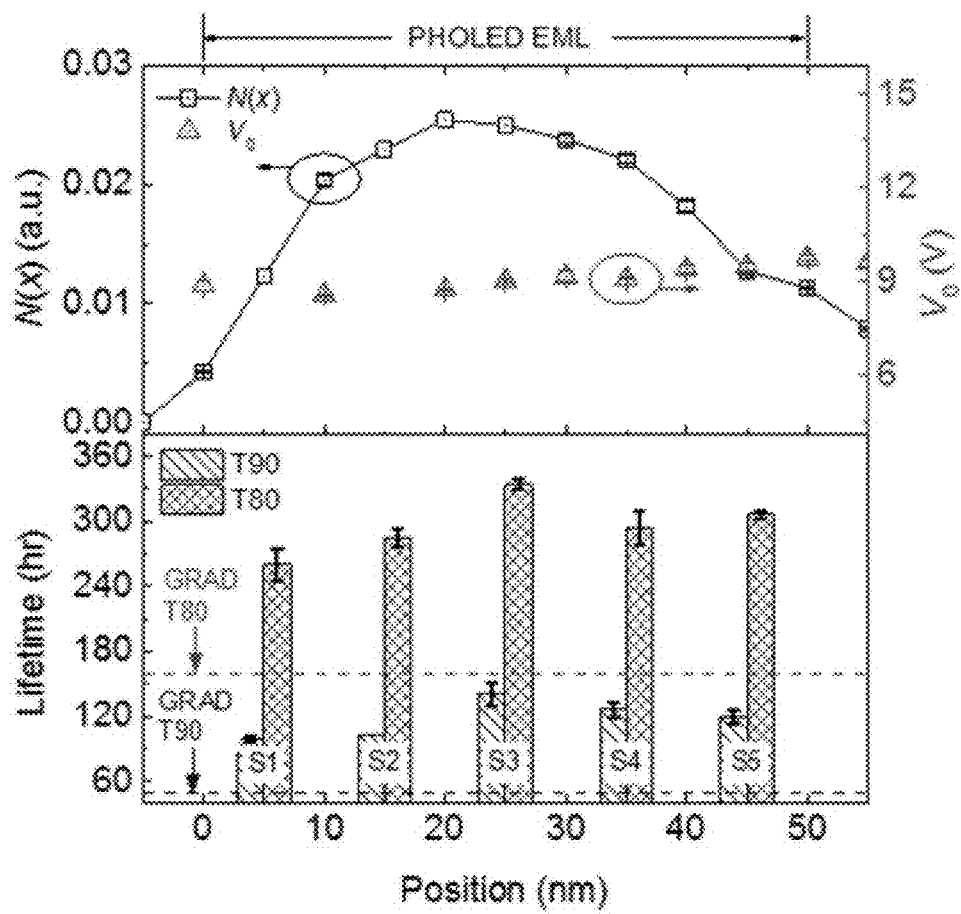
FIG. 8B shows the measured triplet density profile, N(x), in the GRAD device's EML.

FIG. 8B shows the measured triplet density profile, N(x), in the GRAD EML at $J_0$=5 mA/cm², where x is the distance from the EML/HTL interface (see the discussion in Methods and Supplementary S2 sections below). The T90 and T80 values of the managed PHOLEDs (S1 through S5) are shown relative to their position in the EML in the lower panel in FIG. 8B. For example, S3 device which has the greatest T90 and T80 values has its manager molecules located in the 10 nm thick zone that is at distance x that is 20 nm<x<30 nm from the HTL/EML interface. According to the upper panel in FIG. 8B, the location of the manager molecules in S3 has the highest exciton density relative to those of other managed devices. Hence, it is anticipated that the effectiveness of the manager is greatest at the position

TABLE 1

Electroluminescent and lifetime characteristics for GRAD and managed PHOLEDs (S0~S5) at $L_0$ = 1,000 cd/m²

| Device | $J_0$ [mA/cm²] | EQE [%] | $V_0$ [V] | CIE | T90 [hr] | T80 [hr] | ΔV(T90) [V] | ΔV(T80) [V] |
|---|---|---|---|---|---|---|---|---|
| NC D | 6.9 | 11.0 ± 0.2 | 8.9 | [0.16, 0.31] | 36 | 110 | 0.2 | 0.3 |
| YZ D1 | 6.2 ± 0.1 | 8.5 ± 0.1 | 6.9 ± 0.2 | [0.16, 0.31] | 15 | 56 | 0.2 | 0.4 |
| YZ D3 | 5.7 ± 0.1 | 9.5 ± 0.1 | 7.7 ± 0.1 | [0.16, 0.31] | 52 | 213 | 0.3 | 0.6 |
| CONV | 6.7 ± 0.1 | 8.0 ± 0.1 | 6.6 ± 0.0 | [0.15, 0.28] | 27 ± 4 | 93 ± 9 | 0.3 ± 0.1 | 0.4 ± 0.1 |
| GRAD | 5.7 ± 0.1 | 8.9 ± 0.1 | 8.0 ± 0.0 | [0.16, 0.30] | 47 ± 1 | 173 ± 3 | 0.6 ± 0.1 | 0.9 ± 0.1 |
| S0 | 5.5 ± 0.1 | 9.4 ± 0.1 | 9.2 ± 0.0 | [0.16, 0.30] | 71 ± 9 | 226 ± 9 | 0.9 ± 0.1 | 1.2 ± 0.1 |
| S1 | 5.4 ± 0.1 | 9.5 ± 0.1 | 8.8 ± 0.1 | [0.16, 0.29] | 99 ± 3 | 260 ± 15 | 1.2 ± 0.1 | 1.6 ± 0.1 |
| S2 | 5.4 ± 0.1 | 9.3 ± 0.0 | 8.9 ± 0.1 | [0.16, 0.31] | 103 ± 0 | 285 ± 8 | 0.7 ± 0.1 | 1.0 ± 0.1 |
| S3 | 5.3 ± 0.1 | 9.6 ± 0.0 | 9.0 ± 0.1 | [0.16, 0.30] | 141 ± 11 | 334 ± 5 | 1.1 ± 0.1 | 1.5 ± 0.2 |
| S4 | 5.2 ± 0.1 | 9.6 ± 0.2 | 8.6 ± 0.0 | [0.16, 0.31] | 126 ± 7 | 294 ± 16 | 1.0 ± 0.1 | 1.3 ± 0.1 |
| S5 | 5.1 ± 0.1 | 9.9 ± 0.1 | 8.6 ± 0.0 | [0.16, 0.31] | 119 ± 6 | 306 ± 3 | 0.9 ± 0.1 | 1.2 ± 0.1 |

CIE was measured at current density of J = 5 mA/cm².

The errors for the measured values are standard deviation from three devices.

FIG. 8A shows the time evolution of the increase in operating voltage, $\Delta V(t)=V(t)-V_0$, and normalized luminance loss, $L(t)/L_0$ of GRAD and the managed PHOLEDs S0, S3, and S5. For these experiments, the PHOLEDs were continuously operated at constant current to yield $L_0$=1,000 cd/m² at t=0 hour. Table 1 summarizes the lifetime characteristics (T90, T80 and ΔV(t) corresponding) for GRAD PHOLED and the managed PHOLEDs. The managed PHOLEDs (S0 through S5) have increased T90 and T80 relative to those of GRAD device. For example, the longest-lived device S3 have T90 and T80 of 141±11 and 334±5 hours, corresponding to an improvement of 200±30% and 90±10%, respectively, from those of GRAD device. When compared with CONV device, S3 achieves an improvement reflected in device S3. The T80 and T90 data for the complete set of the managed PHOLEDs (S1 through S5) can be seen in Table 1.

Finally, the change in voltage, ΔV(t), required to maintain a constant current density $J_0$ of the managed PHOLEDs is larger than that of GRAD PHOLED, while their luminance degradation is slower. See FIG. 8A. This suggests the formation of polaron traps that have no effect on the luminance.

Discussion

Figure 9A:
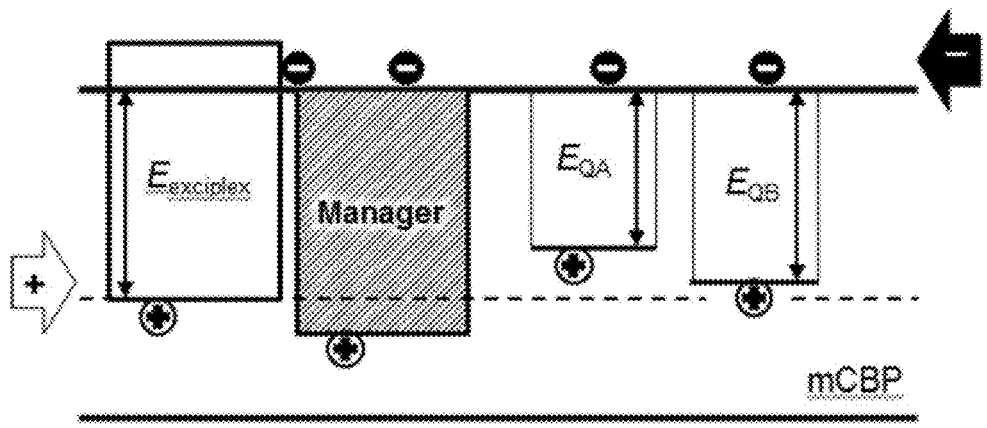
FIG. 9A shows an energy diagram of the EML with the blue dopant, the manager, $Q_A$ and $Q_B$.
Figure 9B:
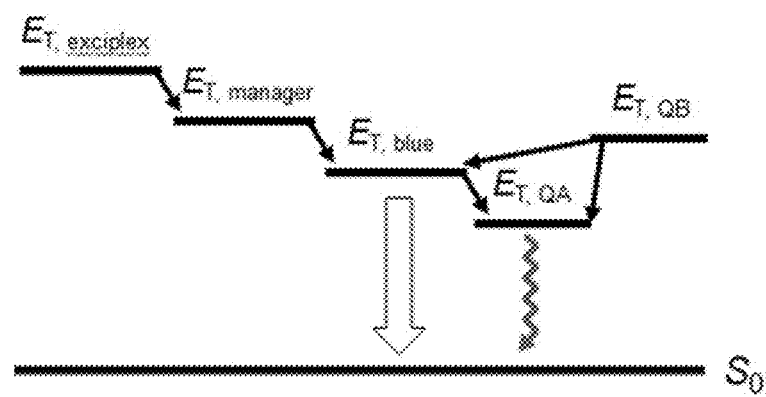
FIG. 9B shows an energy diagram of the triplet exciton states in the given EML.

The degraded products by molecular dissociation can be formed in any and all PHOLED layers, but those located in the EML play a dominant role in affecting the device luminance. On the other hand, changes in the device operating voltage can arise from defects generated both within and outside the EML. Therefore, a premise in understanding device lifetime is that both the energetics and positions of the defects in the PHOLEDs can influence their performance in different ways. To model the lifetime data, we assume that two types of dissociated products or defects, A and B (with $Q_A$ and $Q_B$ representing the quantity of the dissociated products A and B, respectively), are generated by the hot triplet states within the EML. Referring to FIG. 9A, for simplicity, both $Q_A$ and $Q_B$ are assumed to be hole traps, with $Q_A$ lying deeper in the energy gaps of the host and dopant than $Q_B$. Holes are transported by the blue dopant and the manager, and are potentially trapped by $Q_A$ and $Q_B$. Electrons are transported by the host and the manager. FIG. 9B shows an energy diagram of the triplet exciton states in a given EML. The sources of triplet excitons in the "fresh" device due to the charge recombination are twofolds: triplet exciplex ($E_{T,\ exciplex}$) generated between the host and the blue dopant, and triplet excitons directly formed on the manager ($E_{T,\ manager}$). Both can exothermically transfer to that of the blue dopant ($E_{T,\ blue}$). $Q_A$, the deep trap, has the low-energy triplet state to quench the exciton ($E_{T,\ QA}$), while $Q_B$, the shallow trap ($E_{T,\ QB}$), transfers exciton to the lower energy sites. Both traps are charged when filled, leading to an increase in voltage, $\Delta V(t)$. Shockley-Read-Hall (SRH) nonradiative recombination occurs for holes trapped on $Q_A$. Likewise, exciton quenching via triplet states of $Q_A$ results in a decrease in luminance. On the other hand, shallow $Q_B$ defects can capture excited states that are subsequently transferred to the blue dopant, and thus do not affect the PHOLED luminance. Note that the triplet state energy on the blue dopant (at energy $E_{T,blue}$) transfer from exciplex states originally formed between the hole on the blue dopant and the electron on the host ($E_{T,exciplex}$), as well as from excitons formed directly on the manager ($E_{T,manager}$). The latter is possible because as implied by the energy scheme in FIGS. 9A and 9B, the manager was shown to transport both electrons and holes in the given EML (see Supplementary Information S1).

Based on these considerations, inventors have defined a lifetime model by fitting $L(t)/L_0$ and $\Delta V(t)$ of CONV, GRAD, and managed PHOLEDs (See FIG. 8B and Methods section below). The best fit is provided by assuming that defects generated in the EML are the result of TTA (see discussion in Supplementary Information S3 below). This differs from inventors' previous conclusions claiming that TPA is the dominant path to failure, although it was noted that both TPA and TTA might be active in defect formation. Indeed, whether TPA or TTA is the dominant degradation mechanism depends on several factors including the details of the materials used for the host and guest, the distribution of charges and excitons within the EML at a particular current density, and so forth. In either case, inventors' model implicates excited hot triplet states as the source of the loss of luminance and the rise in operating voltage in the managed PHOLEDs studied. Thus, introducing triplet managers in regions with the highest exciton density should result in the longest lifetime as is indeed the case for S3 PHOLED as apparent in FIG. 7B.

The model also includes the effects of degradation of layers outside the EML, resulting in the increase of the operating voltage without affecting luminance. These include the degradation of charge transport (i.e. HTL and ETL) or blocking materials, and the electrodes, all of which are commonly observed in aged devices. This "external" degradation is assumed to be due to polaron-induced charge traps of density $Q_{ext}$ (ref). Unlike $Q_A$ and $Q_B$ however, $Q_{ext}$ only accounts for $\Delta V$ and not $\Delta L$ (see eq. (6) in Methods, and Supplementary S3). For simplicity of the model, it is assumed that charge and exciton blocking properties of the devices are unchanged over time.

TABLE 2 summarizes the parameters used for fitting the lifetime data for CONV, GRAD, and the managed PHOLEDs.

| Device | $k_{QN}$ [$10^{-11}$ cm$^3$/s] | $k_Q$ [$10^{-7}$ cm$^3$/s] | $k_{QA}$ [$10^{-21}$ cm$^3$/s] | $k_{QB}$ [$10^{-11}$ cm$^3$/s] | $k_{Qext}$ [$10^{-21}$ cm$^3$/s] |
|---|---|---|---|---|---|
| CONV | 3.3 ± 0.4 | 0.7 ± 0.2 | 0.9 ± 0.1 | 1.0 ± 0.1 | 0.06 ± 0.01 |
| GRAD | 2.3 ± 0.2 | 0.9 ± 0.2 | 0.9 ± 0.1 | 1.0 ± 0.1 | 0.2 ± 0.01 |
| S0 | 2.3 ± 0.1 | 1.3 ± 0.2 | 1.0 ± 0.1 | 1.0 ± 0.1 | 0.5 ± 0.1 |
| S1 | 2.1 ± 0.1 | 1.6 ± 0.2 | 0.9 ± 0.1 | 1.0 ± 0.1 | 0.8 ± 0.1 |
| S2 | 1.9 ± 0.1 | 3.0 ± 0.7 | 0.9 ± 0.1 | 0.9 ± 0.1 | 0.5 ± 0.1 |
| S3 | 1.9 ± 0.1 | 3.0 ± 0.8 | 0.9 ± 0.1 | 0.9 ± 0.1 | 1.0 ± 0.3 |
| S4 | 2.1 ± 0.1 | 2.1 ± 0.5 | 0.9 ± 0.1 | 1.0 ± 0.1 | 0.8 ± 0.2 |
| S5 | 2.0 ± 0.1 | 0.9 ± 0.1 | 0.9 ± 0.1 | 1.0 ± 0.1 | 0.3 ± 0.1 |

The errors for the model parameters are the 95% confidence interval for fit.

The defect generation rates $k_{QA}$ and $k_{QB}$, are similar for most devices, yielding nearly similar $Q_A$ and $Q_B$ in the managed PHOLEDs, which are smaller than those in the GRAD and CONV devices over the same operational period, t. For example, $Q_A$ and $Q_B$ in the managed S3 device for t=100 hr are (5.4±0.1) and (5.5±0.1)×10$^{16}$ cm$^{-3}$, while those in GRAD device are (6.1±0.2) and (6.3±0.1)×10$^{16}$ cm$^{-3}$ and those in CONV device are (7.3±0.2) and (8.2±0.1)×10$^{16}$ cm$^{-3}$, respectively. The routes leading to luminance loss are: (i) SRH recombination between the trapped holes on $Q_A$ and electrons at rate $k_{Qn}Q_An$, and (ii) direct exciton quenching by $Q_A$ via $k_{QN}Q_AN$. Here, $k_{Qn}$ and $k_{QN}$ are the reduced Langevin and defect-exciton recombination rates, respectively, and n and N are the steady-state densities of electrons and excitons, respectively (see eq. (3) in Methods section below). Reduction in both terms in the managed PHOLEDs compared to CONV and GRAD devices is mainly attributed to their correspondingly lower $Q_A$, which results in their reduced rate of luminance degradation.

The probability that triplet excitons lead to the molecular dissociation during their natural decay time of $\tau\square\square$ is given by $$Pr(t) = \tau \int_{EML} \frac{dQ_x(x,t)}{dt} dx \Big/ \int_{EML} N(x,t) dx$$

Figure 9C:
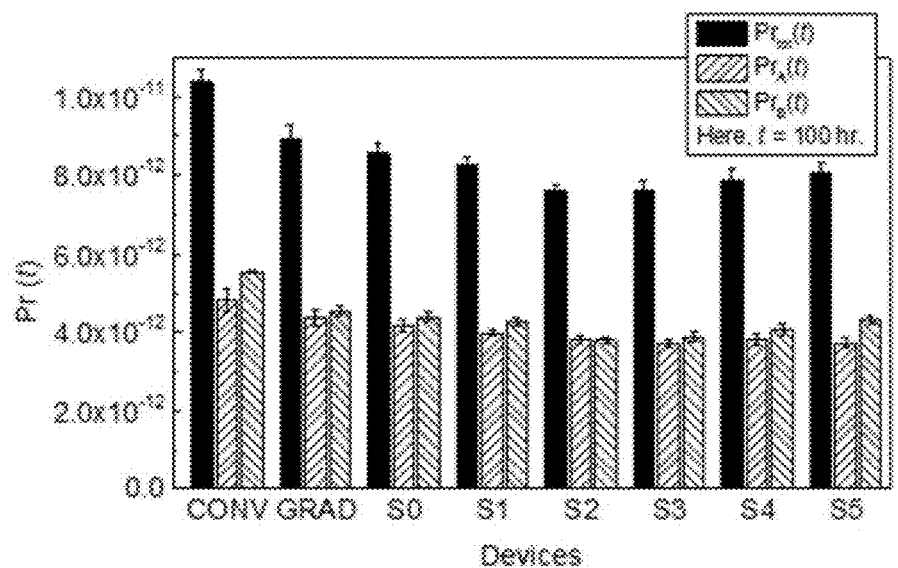
FIG. 9C shows probability of excitons in the EML of CONV, GRAD, and managed PHOLEDs generating $Q_A$, $Q_B$, and both $Q_A+Q_B$ during their natural decay time as $Pr_A(t)$, $Pr_B(t)$, and $Pr_{tot}(t)$, respectively, after the same operating time, $t=100$ hr.

FIG. 9C shows the probabilities for generating $Q_A$ and $Q_B$, and $Q_A+Q_B$ ($Pr_A(t)$, $Pr_B(t)$, and $Pr_{tot}(t)$, respectively) at t=100 hr. For example, $Pr_{tot}$=(1.04±0.03)×10$^{-11}$ for CONV device, which is reduced to $Pr_{tot}=(8.9\pm0.3)\times10^{-12}$ for GRAD device, and further decreases to $Pr_{tot}=(7.6\pm0.2)\times10^{-12}$ for S3 device. We observe a 15% decrease in the probability for molecular dissociation for managed PHOLEDs vs. un-managed state-of-the-art graded doping devices, leading to a nearly 100% improvement in T80. Note that since the luminance loss is primarily due to $Q_A$, the high $Pr_A$ values of CONV, $(4.8\pm0.3)\times10^{-12}$, and GRAD, $(4.4\pm0.2)\times10^{-12}$, leads to a luminance of <800 cd/m² for CONV device, and 850±10 cd/m² for GRAD device, as opposed to that of S3 device which is 920±10 cd/m² with $Pr_A$ value of $(3.7\pm0.1)\times10^{-12}$ at t=100 hr. On the other hand, S3, S4, and S5 devices have similar $Pr_A$ value yielding a luminance of 915±5 cd/m², while $Pr_B$ are (3.9±0.1), (4.1±0.1), and $(4.3\pm0.1)\times10^{-12}$, respectively. This larger variation in $Pr_B$ is observed because $Q_B$ can return excitons to the dopants where they have a renewed opportunity to luminesce, and thus its effect on the reduction in luminance is small compared to $Pr_A$.

The relative contributions of $k_{Qn}Q_An$ and $k_{QN}Q_AN$ to the luminance degradation are 90% and 10%, respectively, for most devices. This indicates that SRH recombination is a dominant luminance loss mechanism in the aged devices. This recombination mechanism results from the presence of a large density of injected polarons that are lost prior to exciton formation.

When excited hot triplet states are generated, molecular dissociation is likely to occur via the relatively weak C—N bonds in the aromatic host (e.g. mCBP). However, in blue emitting devices, all molecular bonds are vulnerable to dissociation by the very high energy of the excited hot triplet states (where energy level of T*~5.4-6 eV). That is, $Q_A$ and $Q_B$ may result from many possible molecular fragments or defect species, but for our purposes we simply assign two discrete energy levels without identifying a particular species. This assumption can lead to somewhat larger uncertainties in the hole trapping rate ($k_{Qp}$) compared with other parameters extracted from the model (see Table 2). Nevertheless, we note that $k_{Qp}$ is generally higher for the managed PHOLEDs than that for CONV or GRAD devices, possibly resulting from energy levels arising from multiple species. This is offset by a small density of $Q_A$ in the managed PHOLEDs, additional exciton generation on $Q_B$ (see Eq. (3)), and reduced exciton loss via a smaller value of $k_{QN}$.

Compared to CONV and GRAD devices, the managed PHOLEDs have a lower rate of exciton-defect interactions ($k_{QN}$), indicating that fewer excitons are eliminated due to the quenching by $Q_A$ (see FIG. 9C). Now, $k_{QN}\cong2.0\times10^{-11}$ cm³/s of the managed PHOLEDs is larger by nearly two orders of magnitude than the TTA rate of $k_{TT}\cong1.0\times10^{-13}$ cm³/s obtained from the transient PL of the as-grown PHOLED EML. This implies that the luminance efficiency is mainly impacted by defect-related exciton loss rather than to the increased TTA, while the latter reaction still plays a critical role in triggering molecular dissociation reactions.

Figure 9D:
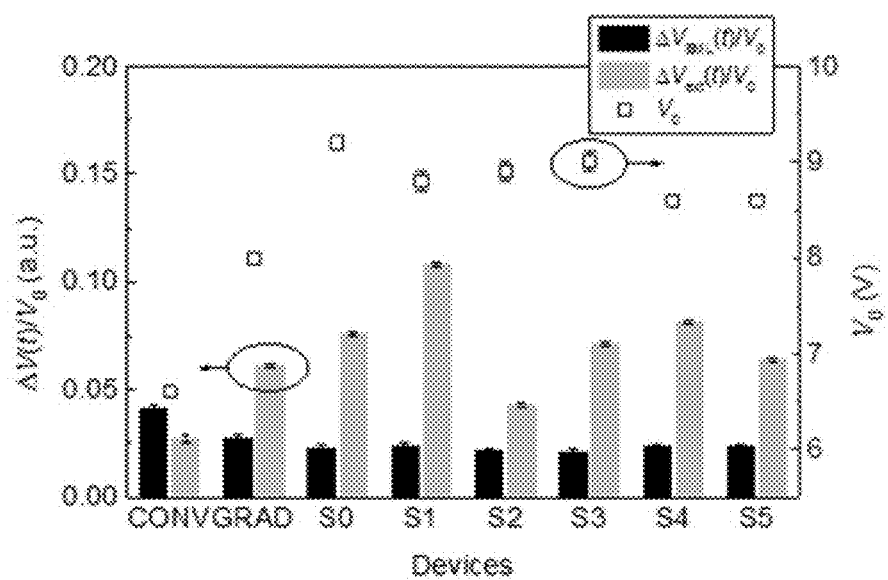
FIG. 9D shows $\Delta V_{EML}(t)/V_0$ and $\Delta V_{ext}(t)/V_0$ for CONV, GRAD and managed PHOLEDs, which are the relative contributions to the total voltage rise induced by defects within and outside of the EML at $t=100$ hr with respect to $V_0$.

FIG. 9D shows $\Delta V_{EML}(t)/V_0$ and $\Delta V_{ext}(t)/V_0$ for CONV, GRAD and managed PHOLEDs, which are the relative contributions to the total voltage rise induced by defects within and outside of the EML (i.e., $Q_A+Q_B$ and $Q_{ext}$, respectively) at t=100 hr with respect to $V_0$. CONV and GRAD PHOLEDs have relatively high $\Delta V_{EML}(t)$ compared to the managed devices due to the higher defect densities in the EML. Also note that the relative contributions to the total voltage rise is dominated by $Q_{ext}$ for the resistive devices (i.e. GRAD and managed PHOLEDs compared to CONV PHOLED), which also have a slightly higher $V_0$. Due to a lack of this consideration, previous models underestimated $\Delta V(t)$ or added the constant value to explain the discrepancy between the model and the measurement (see also the discussion in Supplementary Information S3 section below).

The generation rate of $Q_{ext}$ that leads to the voltage rise, $\Delta V_{ext}(t)$ is $k_{Qext}$, which is generally higher for the managed PHOLEDs than CONV and GRAD PHOLEDs. This results from the higher resistivity of the devices due to thick EML, as well as the low hole mobility of the manager relative to that of the blue dopant (see FIG. 3b and the discussion in Supplementary Information S1 section below). Using a simple approximation based on space-charge-limited transport, the effective mobility in the managed EML is reduced by nearly 20% compared to that of the EML in the GRAD PHOLED. Due to the limited hole transport in the managed devices, the polaron density in their HTL is increased, accelerating its degradation. Note that when extracting $k_{Qext}$ and thus $\Delta V_{ext}(t)$ from the fits, the polaron densities in the EML at $J_0$ are used. However, $k_{Qext}$ should more accurately reflect the polaron densities in the transport layers due to charge trapping by $Q_{ext}$, and thus, the reduction in layer conductivity. This simplifying assumption leads to its large variation among devices compared with other parameters.

In summary, $L(t)/L_0$ is accurately modeled by assuming the formation of both deep ($Q_A$) and shallow defects ($Q_B$) in the EML. To fully account for $\Delta V(t)$, however, defects formed in other non-luminescent layers of the PHOLEDs ($Q_{ext}$) must be also taken into consideration.

Finally, the excited hot triplet state management strategies described herein may also be useful in extending the lifetime of OLEDs based on TADF emission. Similar to electrophosphorescence, the TADF process is based on the generation of triplets with natural lifetimes typically greater than 5 µs. Hence, these devices should, in principle, undergo the same degradation process as PHOLEDs. Indeed, to date, TADF OLEDs have shown lifetimes considerably shorter than those based on phosphorescence, with the problem once more being particularly acute for blue emission.

In summary, inventors introduced a strategy to manage hot excited states, otherwise, that would lead to dissociative reactions and deteriorate the operational stability of higher energy emitters, especially blue PHOLEDs. By introducing the excited state manager in the PHOLED EML, one can attain longer lifetime (See discussion in Supplementary Information S4 section below). Our findings emphasize the importance of physics-based solutions such as the excited state management or similar approaches to further improve the lifetime of blue PHOLEDs, in addition to the requirement for stable dopants, hosts and transport materials. Based on our work, we suggest that the properties required for successful manager molecules are as follows: (i) high molecular stability, (ii) wide energy gap intermediate between that of the host and dopant molecules and their hot excited states, (iii) significant molecular orbital overlap with the EML components to ensure rapid energy transfer prior to molecular degradation, and (iv) energetic and morphological properties that can assist in charge transport. We also developed a phenomenological theory that establishes the roles and characteristics of defects present in the device.

Based on the present disclosure, according to an embodiment, an organic light emitting device, such as a PHOLED or other OLED, is disclosed. The organic light emitting device comprises: an anode; a cathode; and an organic layer, disposed between the anode and the cathode, comprising a emissive layer, wherein the emissive layer comprises a host material, a first dopant, and a second dopant. The first dopant is an emissive dopant and has a dissociative energy level at which multiply-excited excitons and/or polarons undergo a dissociative reaction which may cause damage to the host molecule. In general, the most damaging reaction is when an exciton on the dopant and a polaron on the host undergo triplet-polaron quenching, which typically will cause damage to the host. The second dopant is an excited energy state managing dopant. The second dopant comprises between 2-10 vol. % of the emissive layer and has a lowest triplet state energy level, $T_M$, that is higher than a lowest triplet state energy levels, $T_1$, of both the host and the first dopant and lower than the multiply-excited energy level, $T^*$, of the first dopant.

Generally, the first dopant may be a phosphorescent emissive dopant or a fluorescent emissive dopant. The first dopant also may be one that is selected to provide thermally activated delayed fluorescence (TADF). The dopant may be one that emits light of any color, though it is expected that the benefits of the present invention will be particularly suited to blue-emitting dopants or those that emit in wavelength less than or equal to 500 nm.

In some preferred embodiments, the second dopant comprises less than or equal to 6 vol. % of the emissive layer. In some preferred embodiments, the second dopant comprises less than or equal to 3 vol. % of the emissive layer.

In some preferred embodiments, the second dopant is located in a zone in the emissive layer that has the highest exciton density within the emissive layer.

In some embodiments, the organic light emitting device further comprises: a hole transporting layer (HTL) provided between the emissive layer (EML) and the anode and in direct contact with the EML and forming an HTL/EML interface; and an electron transporting layer (ETL) provided between the EML and the cathode and in direct contact with the EML and forming an ETL/EML interface; wherein the first dopant is present in the emissive layer in a linearly graded concentration level that is at the highest concentration level at the HTL/EML interface and the lowest concentration level at the ETL/EML interface.

Manager Dopant Candidates

According to some embodiments, the second dopant, the excited energy manager dopant, can be selected from the following carbazole-based compounds. These candidate compounds have high $T_1$ triplet state energy greater than 2.9 eV suitable for PHOLEDs or fluorescent OLEDs emitting at wavelengths less than 500 nm. These candidate compounds also have Tg glass transition temperature greater than 100° C. for the morphological stability.

| Acronym | Structure | HOMO (eV) | LUMO (eV) | Triplet (eV) | Glass transition temp (° C.) |
|---|---|---|---|---|---|
| FPCC | 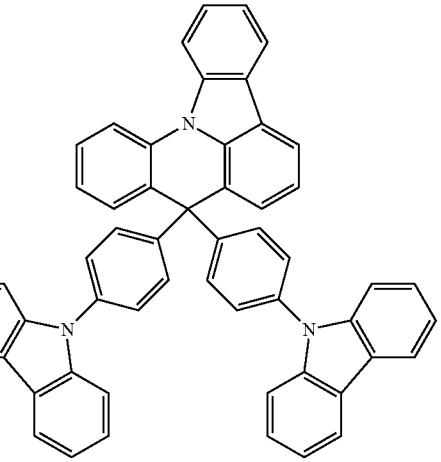 | 6.03 | 2.65 | 2.96 | 149 |
| FPCA | 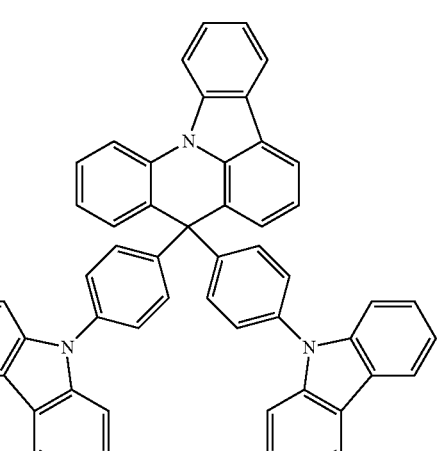 | 5.78 | 2.42 | 2.90 | 142 |

| Acronym | Structure | HOMO (eV) | LUMO (eV) | Triplet (eV) | Glass transition temp (° C.) |
|---|---|---|---|---|---|
| BiPPA | 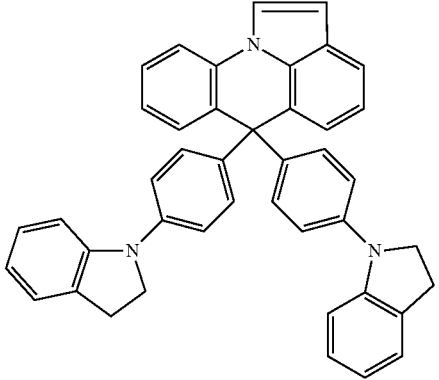 [SMILES: c1ccc2c(c1)CCN2c1ccc(C2(c3ccc(N4CCc5ccccc54)cc3)c3ccccc3-n3ccc4cccc2c43)cc1] | 5.90 | 2.09 | 2.94 | 123 |
| BCPPA | 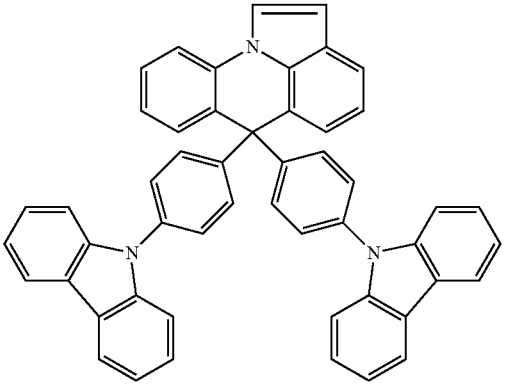 [SMILES: c1ccc2c(c1)-n1ccc3cccc(c31)C2(c1ccc(-n2c3ccccc3c3ccccc32)cc1)c1ccc(-n2c3ccccc3c3ccccc32)cc1] | 6.04 | 2.24 | 2.98 | 125 |
| DCDPA | 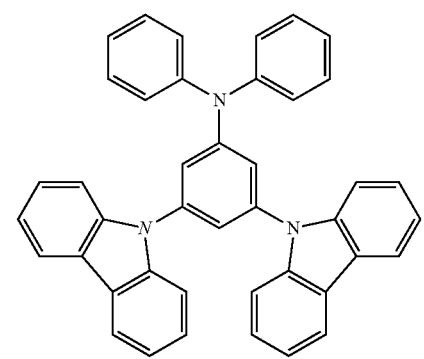 [SMILES: c1ccc(N(c2ccccc2)c2cc(-n3c4ccccc4c4ccccc43)cc(-n3c4ccccc4c4ccccc43)c2)cc1] | 5.88 | 2.34 | 2.90 | 109 |

| Acronym | Structure | HOMO (eV) | LUMO (eV) | Triplet (eV) | Glass transition temp (° C.) |
|---|---|---|---|---|---|
| BCz2 | 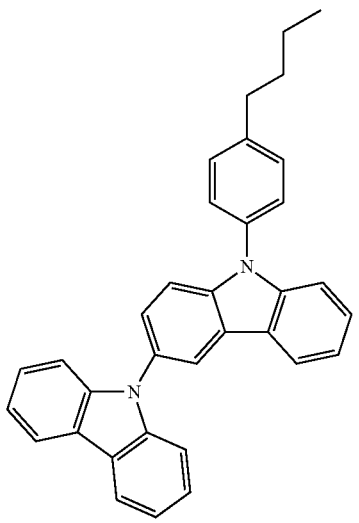 [SMILES: CCCCc1ccc(-n2c3ccccc3c3cc(-n4c5ccccc5c5ccccc54)ccc32)cc1] | — | — | 3.00 | 104 |
| TCz2 | 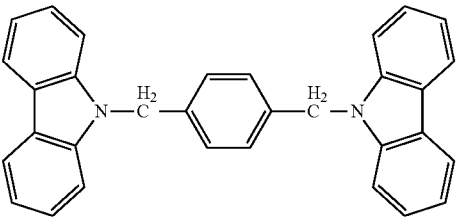 [SMILES: c1ccc2c(c1)c1ccccc1n2Cc1ccc(Cn2c3ccccc3c3ccccc32)cc1] | — | — | 2.94 | 150 |
| DCb | 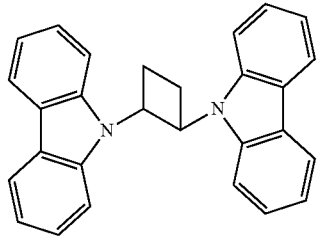 [SMILES: c1ccc2c(c1)c1ccccc1n2C1CCC1n1c2ccccc2c2ccccc21] | 5.9 | 2.4 | 2.95 | — |
| DCz | 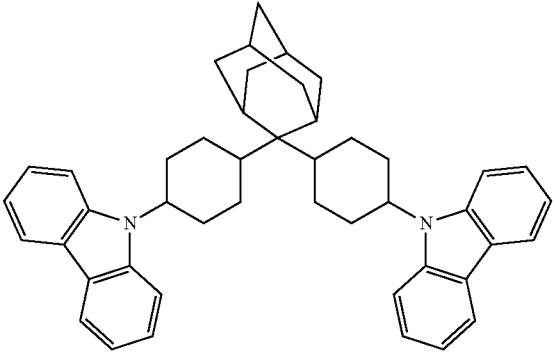 [SMILES: c1ccc2c(c1)c1ccccc1n2C1CCC(C2(C3CCC(n4c5ccccc5c5ccccc54)CC3)C3CC4CC(C3)CC2C4)CC1] | 5.7 | 2.2 | 2.95 | — |

| Acronym | Structure | HOMO (eV) | LUMO (eV) | Triplet (eV) | Glass transition temp (° C.) |
|---|---|---|---|---|---|
| TSPC | 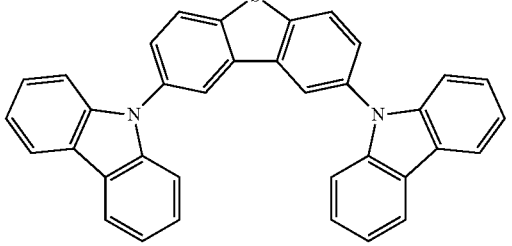 | 6.03 | 2.49 | 3.01 | 107 |

According to some embodiments, the second dopant can be selected from the following platinum-based compounds:

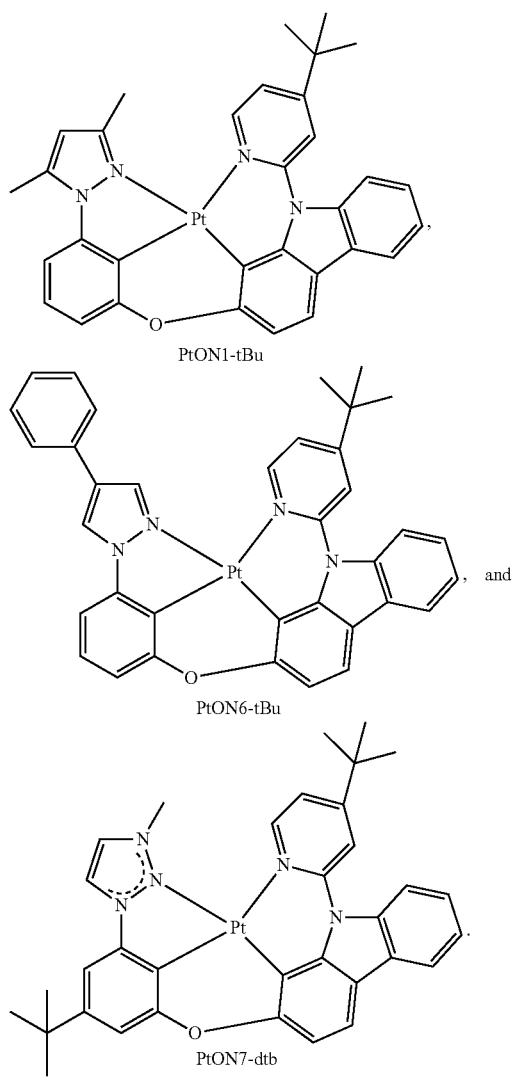

PtON1-tBu

PtON6-tBu, and

PtON7-dtb

Methods

Device fabrication and characterization—PHOLEDs used for generating the experimental data were grown by vacuum sublimation at a base pressure of $4 \times 10^{-7}$ Torr on the patterned indium-tin-oxide (ITO) glass substrates (VisionTek Systems Ltd., United Kingdom). The device area is defined to be 2 mm$^2$ using a shadow mask, and the device structure of GRAD and managed PHOLEDs is as follows: 70 nm ITO as an anode/5 nm HATCN as a hole injection layer (HIL)/10 nm CPD as a hole transport layer (HTL)/50 nm EML/5 nm mCBP:Ir(dmp)$_3$ 8 vol % as an exciton stopping layer (ESL)/5 nm mCBP as a hole blocking layer (HBL)/25 nm Alq$_3$ as an electron transport layer (ETL)/1.5 nm Liq as an electron injection layer/100 nm Aluminum as a cathode. The conventional PHOLED (CONV) has the following structure: 5 nm HATCN/30 nm CPD/35 nm 13 vol % Ir(dmp)$_3$ uniformly doped in mCBP/5 nm mCBP/25 nm Alq$_3$/1.5 nm Liq/100 nm Aluminum. Here, HATCN is the chemical acronym for Dipyrazino[2,3,-f:2',3'-h]quinoxaline 2,3,6,7,10,11-hexacarbonitrile, CPD is N,N'-Di(phenyl-carbazole)-N,N'-bis-phenyl-(1,1'-biphenyl)-4,4'-diamine, Alq$_3$ is Tris-(8-hydroxyquinoline)aluminum, and Liq is 8-hydroxyquinolato-Li. Here, ESL is disposed for preventing exciton leak from the manager to HBL (i.e. a neat mCBP layer) particularly for the managed PHOLEDs S0 and S5. ESL is kept in other devices for the consistency. HATCN and Alq$_3$ were purchased from Luminescence Technology Corporation, Taiwan, and CPD was from P&H technology, South Korea. mCBP and Ir(dmp)$_3$ were provided by Universal Display Corporation, United States, and mer-Ir(pmp)$_3$ was synthesized according to the procedure described in Lee, J. et al. *Deep blue phosphorescent organic light-emitting diodes with very high brightness and efficiency.* Nat. Mater. 15, 92-98 (2016). The J-V-L characteristics of PHOLEDs were measured using a parameter analyzer (HP4145, Hewlett-Packard) and a calibrated Si-photodiode (FDS1010-CAL, Thorlab) according to the standard procedure. See e.g., Forrest, S. r., Bradley, D. d. c. & Thompson, M. e. *Measuring the Efficiency of Organic Light-Emitting Devices.* Adv. Mater. 15, 1043-1048 (2003). The PHOLED emission spectra is recorded using the calibrated spectrometer (USB4000, OceanOptics). For the lifetime test, PHOLEDs were operated by constant current sources (U2722, Agilent) and the luminance and voltage signals were collected by a data logger (Agilent 34972A).

Exciton profile measurement by delta-doped sensing—Local exciton density, N, as a function of the position, x, in the EML was measured by inserting a ultrathin sensing layer with the thickness of ~1 Å. Here, a sensing layer is the neat, red phosphorescent emitter [iridium (III) bis (2-phenylquinolyl-N, C$^{2'}$) acetylacetonate (PQIr)] which is included at x and attracts the excitons from the blue dopant [Ir(dmp)$_3$] nearby within the Förster transfer length of ~3 nm. Integrated emission intensities of PQIr and Ir(dmp)$_3$ at an operating current density, $J_0$, are converted into the number of excitons at x and those in the rest of EML. Viz., $$I_{sens}(\lambda,x) = a_{PQIr}(x)I_{PQIr}(\lambda) + a_{Ir(dmp)_3}(x)I_{Ir(dmp)_3}(\lambda) \quad \text{Eq. (1)}$$

where $I_{sens}(\lambda, x)$ is the emission spectrum of the sensing device with delta-doped PQIr at x, consisting of the spectra of Ir(dmp)$_3$ [$I_{Ir(dmp)_3}(\lambda)$] and PQIr [$I_{PQIr}(\lambda)$] with the relative weight of $a_{PQIr}(x)$ and $a_{Ir(dmp)_3}(x)$, respectively. Then, the "outcoupled" exciton density, $\eta_{out}(x)N(x)$, is equal to the relative number of excitons emitting on the PQIr at x as $$\eta_{out}(x)N(x) = A \cdot EQE(x) \cdot \frac{a_{PQIr}(x)\int I_{PQIr}(\lambda)/\lambda d\lambda}{a_{PQIr}(x)\int I_{PQIr}(\lambda)/\lambda d\lambda + a_{Ir(dmp)_3}(x)\int I_{Ir(dmp)_3}(\lambda)/\lambda d\lambda}. \quad \text{Eq. (2)}$$

Here, EQE is total number of extracted photons from the sensing device and thus, the right-hand side of the equation gives the relative number of excitons at position x or emitted from PQIr. A is the normalized factor such that $\int_{EML} N(x) dx = 1$. $\eta_{out}(x)$ is the outcoupling efficiency based on Green's function analysis (Celebi, K., Heidel, T. D. & Baldo, M. A. *Simplified calculation of dipole energy transport in a multilayer stack using dyadic Green's functions*. Opt. Express 15, 1762-1772 (2007)), calculated as an energetic fraction of dipoles at x in the EML outcoupled to the air.

Since the thickness of delta-doped PQIr is less than a monolayer, PQIr molecules are spatially dispersed, avoiding exciton loss by the concentration quenching. A delta-doped sensing layer only slightly affects the charge transport as opposed to the previously used 1-2 nm-thick, doped sensing layer. This leads to that the operating voltages at $J_0$ vary less than <0.5 V among sensing devices with the PQIr inserted at different x (FIG. 8B, bottom and see Supplementary Information S2).

Lifetime degradation model—The rate equations for holes (p), electrons (n) and excitons (N) are given as:

$$\frac{dp(x,t,t')}{dt'} = G(x) - \gamma n(x,t,t')p(x,t,t') - k_{Qp}[Q_A(x,t) + Q_B(x,t)]p(x,t,t'),$$

$$\frac{dn(x,t,t')}{dt'} = G(x) - \gamma n(x,t,t')p(x,t,t') - k_{Qn}[Q_A(x,t) + Q_B(x,t)]n(x,t,t'),$$

$$\frac{dN(x,t,t')}{dt'} = \gamma n(x,t,t')p(x,t,t') + k_{Qn}Q_B(x,t)n(x,t,t') - \left\{\frac{1}{\tau_N} + k_{QN}Q_A(x,t)\right\}N(x,t,t'). \quad \text{Eq. (3)}$$

Here, there are two different time scales: t' with the scale of charge transport and energy transfer times (~microseconds) and t with the scale of the device degradation time (~hours) due to the defect formation, $Q_A(x,t)$ and $Q_B(x,t)$, following from Giebink, N. C. et al. *Intrinsic luminance loss in phosphorescent small-molecule organic light emitting devices due to bimolecular annihilation reactions*. J. Appl. Phys. 103, 44509 (2008). The triplet decay lifetime is $\tau_N = 1.4 \pm 0.1$ μs, obtained from the transient PL decay of thin-film EMLs of the GRAD and managed PHOLEDs. Also, $G(x) = J_0 \cdot N(x)/e\int_{EML} N(x)dx$ is the generation rate of excitons due to charge injection at current, $J_0$, $\gamma = e(\mu_p + \mu_n)/\varepsilon_r\varepsilon_0$ is the Langevin recombination rate, where e is the elementary charge, $\mu_n$ and $\mu_p$ are the electron and hole mobilities in the EML, respectively, and $\varepsilon_0$ and $\varepsilon_r$~3 are the vacuum and relative permittivities, respectively. It follows that $k_{Qn} = e\mu_n/\varepsilon_r\varepsilon_0$ is the reduced Langevin recombination rate describing the recombination of immobile trapped holes and oncoming electrons.

The trap densities of $Q_A$ and $Q_B$ resulting from TTA increase at rates $k_{QA}$ and $k_{QB}$ are given by:

$$\frac{dQ_A(x,t)}{dt} = k_{QA}\{N(x,t)\}^2, \quad \text{Eq. (4)}$$

$$\frac{dQ_B(x,t)}{dt} = k_{QB}\{N(x,t)\}^2.$$

Eq. (3) is solved under the steady state condition (t'→∞), yielding $$\lim_{t'\to\infty} n(x,t,t'), p(x,t,t') \text{ and } N(x,t,t') = n(x,t), p(x,t)$$

and $N(x,t)$, respectively. Then, these are numerically solved with $Q_A(x,t)$ and $Q_B(x,t)$ to fit both the luminance loss and voltage rise as a function of t using:

$$L(t)/L(0) = \int N(x,t)\eta_B(x)dx \quad \text{Eq. (5)}$$

and $$\Delta V(t) = \frac{e}{\varepsilon\varepsilon_0}\left(\int_{EML} xQ(x,t)dx + \int_{ext} x'Q_{ext}(x',t)dx'\right) \quad \text{Eq. (6)}$$

Here, $\eta_B(x)$ is the outcoupling efficiency of the excitons emitted at x, and $Q_{ext}(x',t)$ is introduced to account for the voltage rise caused by traps present outside the EML.

Supplemental Information S1: Transport Mechanisms in the Emission Layer (EML) of PHOLEDs The structures of hole-only (HO) and electron-only (EO) devices are as follow:
HO devices—ITO (ultraviolet-ozone treated)/5 nm HATCN/10 nm CPD/40 nm EML$_x$/10 nm CPD/5 nm HATCN/100 nm Aluminum.
EO devices—ITO (untreated)/5 nm Alq$_3$/10 nm mCBP/40 nm EML$_x$/10 nm mCBP/5 nm Alq$_3$/1.5 nm Liq/100 nm Aluminum.
Here, HO and EO devices have the same EML compositions (denoted as EML$_1$-EML$_4$) with the blue dopant [Ir(dmp)$_3$] and the manager [mer-Ir(pmp)$_3$] doped at various concentrations into the host (mCBP). Specifically,
EML$_1$-mCBP:Ir(dmp)$_3$, 85:15 vol %
EML$_2$-mCBP:Ir(dmp)$_3$:mer-Ir(pmp)$_3$, 85:10:5 vol %
EML$_3$-mCBP:Ir(dmp)$_3$:mer-Ir(pmp)$_3$, 80:15:5 vol %
EML$_4$-mCBP:Ir(dmp)$_3$:mer-Ir(pmp)$_3$, 75:15:10 vol %
Zhang, Y., Lee, J. & Forrest, S. R., *Tenfold increase in the lifetime of blue phosphorescent organic light-emitting diodes*, Nat. Commun. 5, (2014) showed that in the EML$_1$ electrons are transported by the host while holes mostly hop between the blue dopant. Thus, inventors conducted this experiment to identify how the charge transport characteristics is modified by including the manger in the given EML.

Figure 10A:
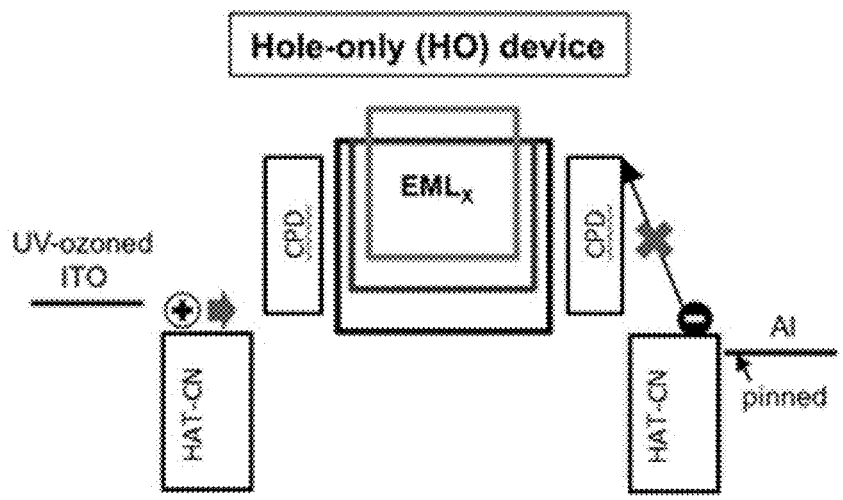
FIG. 10A shows schematic structures of hole-only device.
Figure 10B:
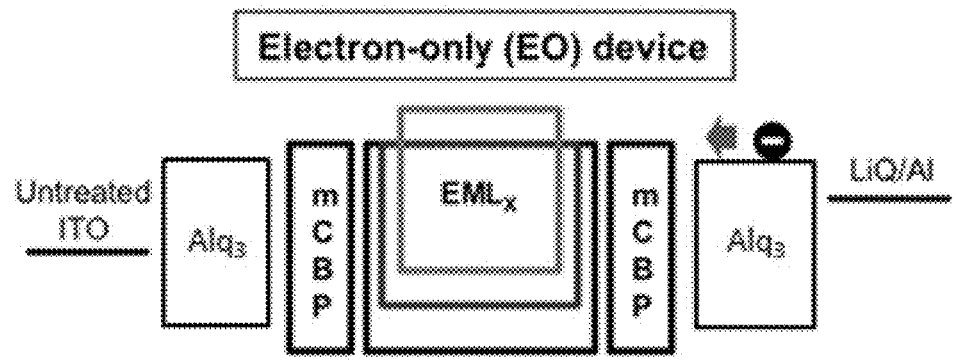
FIG. 10B shows schematic structures of electron-only device.
Figure 11A:
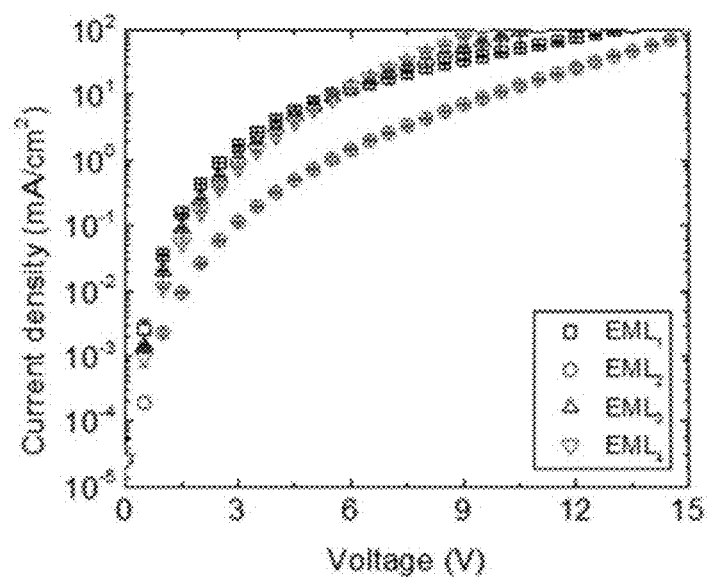
FIG. 11A shows the current density-voltage characteristics of hole-only devices having EML structures $EML_1$, $EML_2$, $EML_3$, and $EML_4$.
Figure 11B:
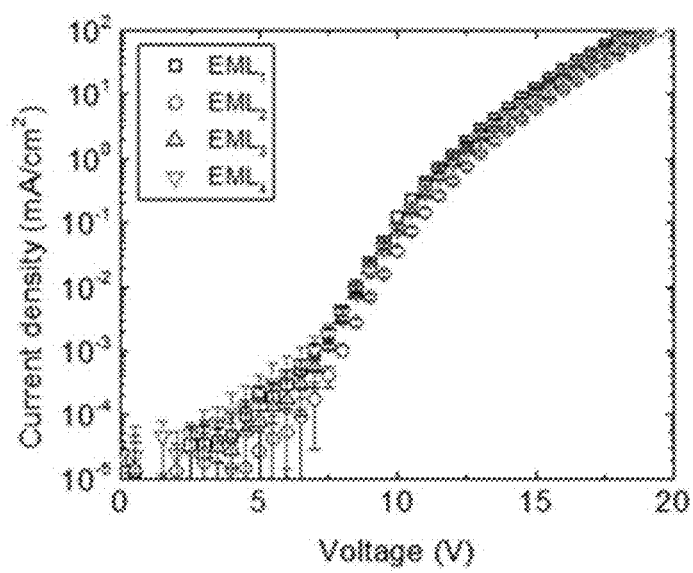
FIG. 11B shows the current density-voltage characteristics of electron-only devices having EML structures $EML_1$, $EML_2$, $EML_3$, and $EML_4$.

The architecture of HO device is schematically shown in FIG. 10A. The architecture of EO device is schematically shown in FIG. 10B. Both types have the same EML structure composed of the blue dopant [Ir(dmp)$_3$] and the manager [mer-Ir(pmp)$_3$] doped at varying concentrations into the host (mCBP).

From the current density (J)-Voltage (V) characteristics of HO devices, we can infer that holes are transported by both the blue dopant and the manager. Hole injection and transport by the blue dopant are shown to be more efficient than those by the manager (see J-V of HO devices, EML$_1$ vs. EML$_2$). This is presumably due to the more stable highest occupied molecular orbital (HOMO) level of the manager (5.3±0.1 vs. 4.8±0.1 eV for the blue dopant). At higher voltages (V>6V), however, the manager also facilitates the hole transport (see EML$_1$ vs. EML$_3$, and EML$_4$ of HO devices).

From the EO devices, it is found that if the concentration of the blue dopant is fixed at 15 vol %, the conductivity of the devices is nearly invariant regardless of variation in the manager and host concentrations (see EML$_1$, EML$_2$, and EML$_4$). Thus, we can infer electrons are transported by both the host and manger, presumably due to their identical lowest unoccupied molecular orbitals (LUMO)=1.5±0.1 eV.

This measurement indicates that the manager conducts both electrons and holes in the managed EML, which can lead to the direct exciton formation on the manager.

Figure 12A:
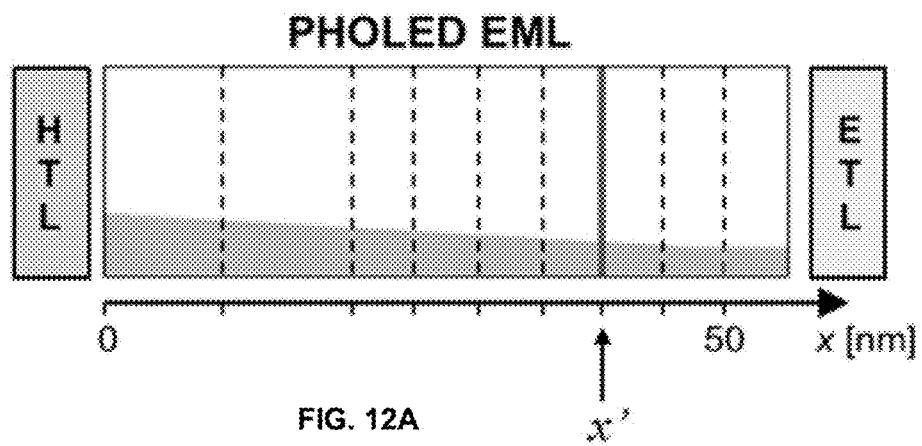
FIG. 12A shows a schematic diagram for probing the local triplet density in the EML at position x
Figure 12B:
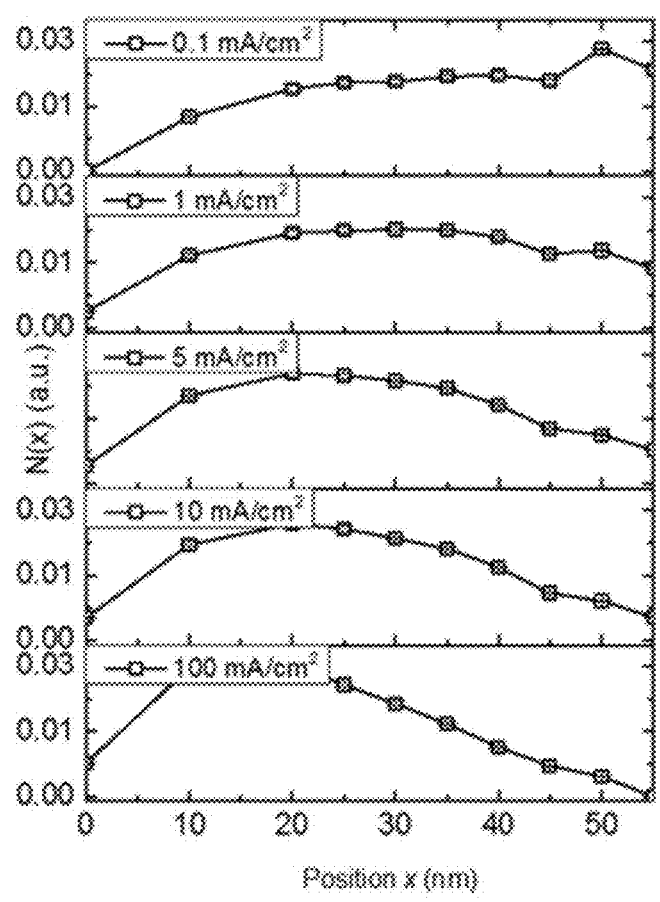
FIG. 12B shows the local exciton density profile, N(x), of the EML of GRAD PHOLED, where x is the distance from the interface between hole transport layer and EML. N(x) is measured at different current density of $J=0.1, 1, 5, 10, 100$ mA/cm$^2$ (arranged from top to bottom).
Figure 12C:
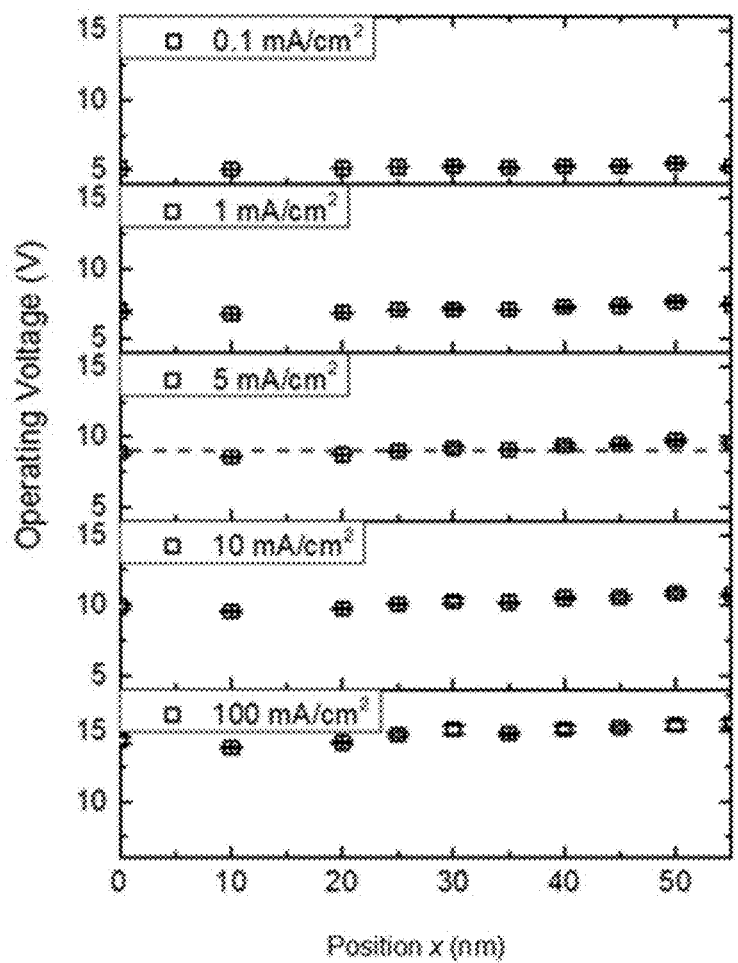
FIG. 12C shows the operating voltage of the PHOLEDs of FIG. 12B having the sensing layer at x are measured at different J.

Supplemental Information S2: Local Exciton Density Profile in the EML of PHOLEDs FIG. 12A shows the schematic diagram for probing the local triplet density in the EML at position x'. At x', the 1 Å-thick red sensing layer, iridium(III)bis(2-phenylquinolyl-N, C$^2$) acetylacetonate (PQIr), is inserted. In FIGS. 12A-12C, the position x is measured from the HTL/EML interface.

FIG. 12B shows the local triplet exciton density profile, N(x), of the EML of GRAD PHOLED (see text) at different current densities of J=0.1, 1, 5, 10 and 100 mA/cm$^2$. At low J<0.1 mA/cm$^2$, excitons are formed close to the cathode side of the EML, indicating more efficient hole penetration and transport than those of the electrons. This is because electrons have to initially overcome the LUMO energy barrier of ~0.5 eV between the electron transport layer (Alq$_3$) and the hole blocking layer (mCBP) to be injected into the EML. Under the higher J or high electric field conditions however, electrons overcoming the LUMO barrier overwhelm the holes in the EML and thereby, the exciton profile shifts towards the anode side. Note that N(x) at an interface between hole transport layer (HTL) and EML (x=0) is nonzero, as opposed to the case where the EML directly faces the hole injection layer, HATCN, which quenches the all excitons nearby. However, N(x) drops substantially to low values near x~0 nm indicating that the triplet energy of HTL is not high enough to efficiently prevent all excitons from leaking from the EML. On the other hand, the fluorescence from the HTL is not observed, indicative of efficient electron blocking by the HTL.

In the lifetime model for the GRAD and managed PHOLEDs, N(x) at J=5 mA/cm$^2$, close to their operational conditions was used. As shown in FIG. 12C, the operating voltages of sensing devices with the ultrathin PQIr at different locations are nearly similar, indicating that the inclusion of the sensing layer does not significantly modify the charge transport in the EML. This confirms the validity of the measured exciton profile.

Supplemental Information S3: Validation of the Lifetime Model

Figure 13A:
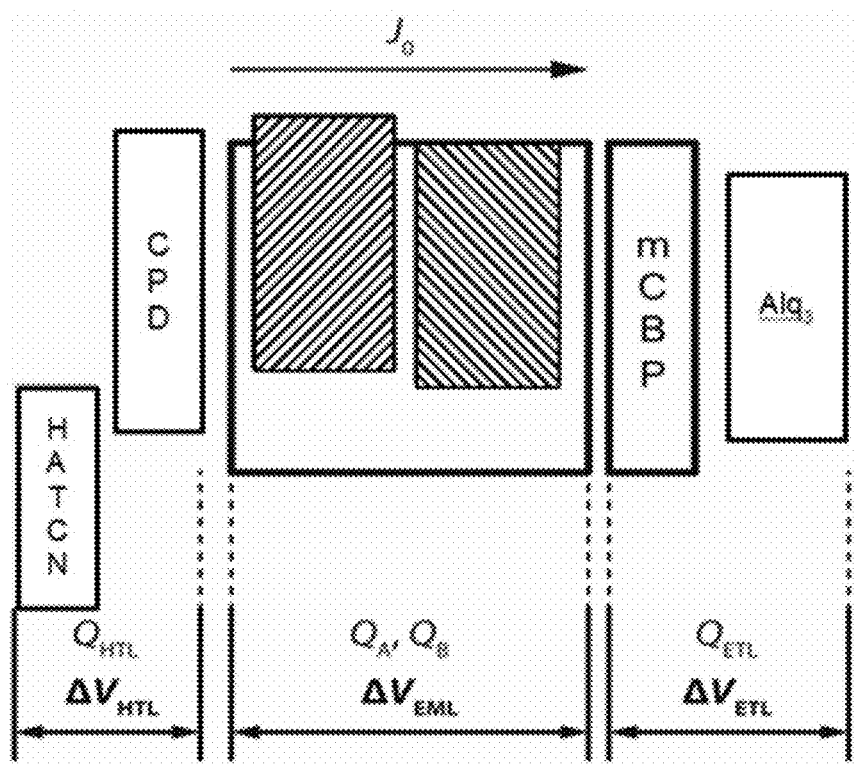
FIG. 13A shows the schematic diagram of the PHOLED structure showing the possible locations of defects formed across the PHOLED structure to account for the lifetime model.

FIG. 13A shows the possible locations of defects formed across the PHOLED structure that supports the lifetime model. Defect densities in the hole transport layer (HTL), EML, and the electron transport layer (ETL) are $Q_{HTL}$, $Q_{EML}$, and $Q_{ETL}$, respectively. All of these defects trap free charge carriers (assumed to be holes in the model) and depending on their locations and the densities, they contribute to the operational voltage rise of the device over time, ΔV(t), as $$\Delta V(t) = \Delta V_{EML}(t) + \Delta V_{HTL}(t) + \Delta V_{ETL}(t)$$

$$= \frac{q}{\varepsilon_0 \varepsilon_r} \left( \int_{EML} x Q_{EML}(x, t) dx + \int_{HTL} x Q_{HTL}(x, t) dx + \int_{ETL} x Q_{ETL}(x, t) dx \right)$$

$$= \frac{q}{\varepsilon_0 \varepsilon_r} \left( \int_{EML} x \{Q_A(x, t) + Q_B(x, t)\} dx + \int_{ext} x Q_{ext}(x, t) dx \right).$$

Figure 13B:
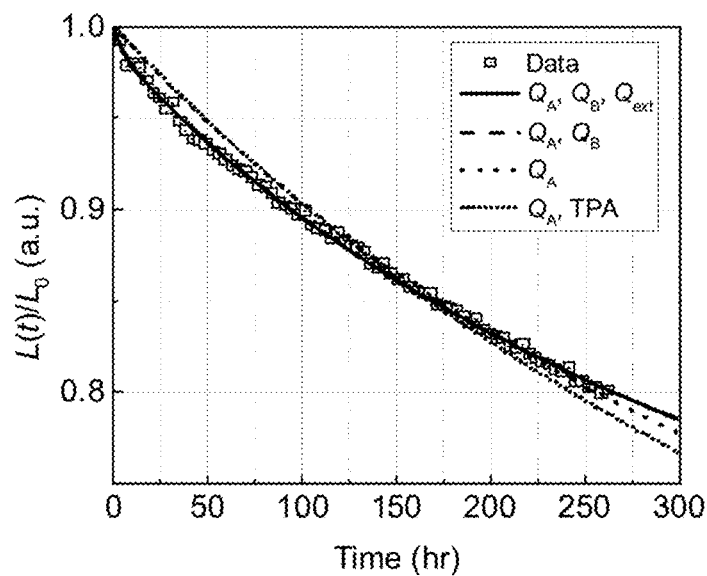
FIGS. 13B and 13C show the lifetime model fit based on different combinations of the defects A and B.
Figure 13C:
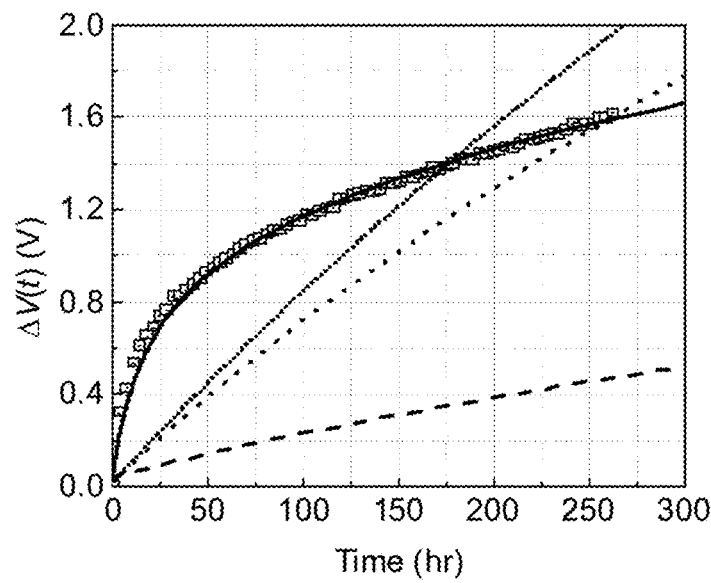

In our model, the defects formed outside the EML i.e. $Q_{HTL}$ and $Q_{ETL}$ are defined as the external defects, $Q_{ext} = Q_{HTL} + Q_{ETL}$. Referring to FIGS. 13B and 13C, the solid and dotted lines show the model fit to the data (represented by the square data points) using various models each having different combinations of the defects as noted in the legend. The legend provided in FIG. 13B applies to both FIGS. 13B and 13C. The lifetime data L(t)/L$_0$ (where L$_0$ represents the luminance at time 0 and L(t) represents the luminance after time t) and ΔV(t), i.e. time evolution of the luminance degradation and the change in operational voltage, of the managed PHOLED S1 is used as an example. FIG. 13B shows the time evolution of the lumance degredation plotted with square data points. FIG. 13C shows the operational voltage rise plotted with square data points.

Compared to the model with a complete set of defects (the solid line), the plot excluding $Q_{ext}$ (long dashed line) underestimates ΔV(t), while providing the reasonable fit for L(t)/L$_0$. This is because L(t)/L$_0$ is affected by the defects within the EML ($Q_{EML} = Q_A + Q_B$), as well as the electron, hole, and excitons, which are determined by the constant current density of J$_0$ and the measured recombination profile of G(x)=J$_0$·N(x)/e$\int_{EML}$N(x)dx. On the other hand, voltage rise occurring within the EML [ΔV$_{EML}$(t)] is not sufficient to account for ΔV(t) as the model shows, and thus the defects that are present outside of the EML [ΔV$_{ext}$(t)] should be taken into account.

If only one type of the EML defect ($Q_A$) with $Q_{ext}$ is assumed, the model's fit for both L(t)/L$_0$ and ΔV(t) deviate from the data. This necessitates the need of shallow defects ($Q_B$) in the model, which trap charges but also contribute to the exciton generation. Finally, the fit from the classic model assuming $Q_A$ and triplet-polaron annihilation (TPA) for the defect generation is also shown to deviate from data.

Figure 13D:
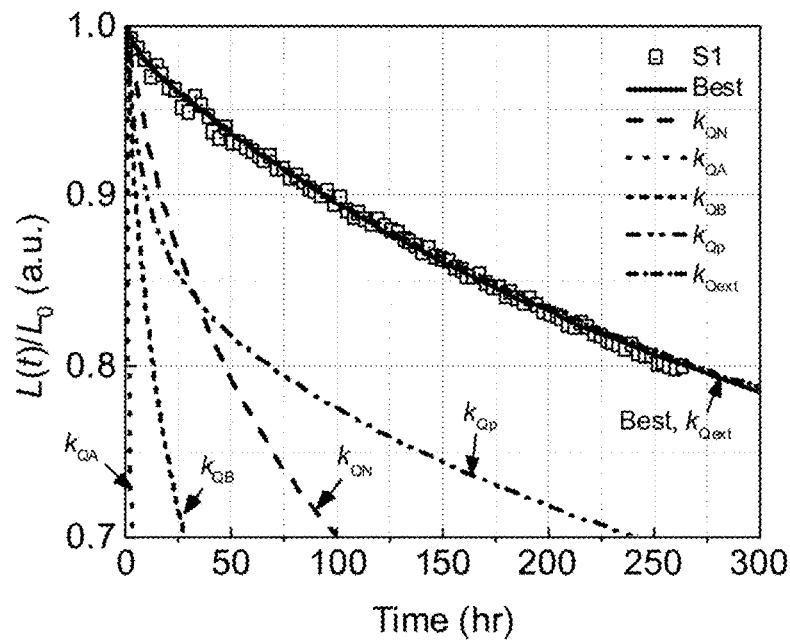
FIGS. 13D and 13E show the lifetime model fit based on the defect generation rates $k_{QN}$, $k_{QA}$, $k_{QB}$, $k_{QP}$ and $k_{Qext}$.
Figure 13E:
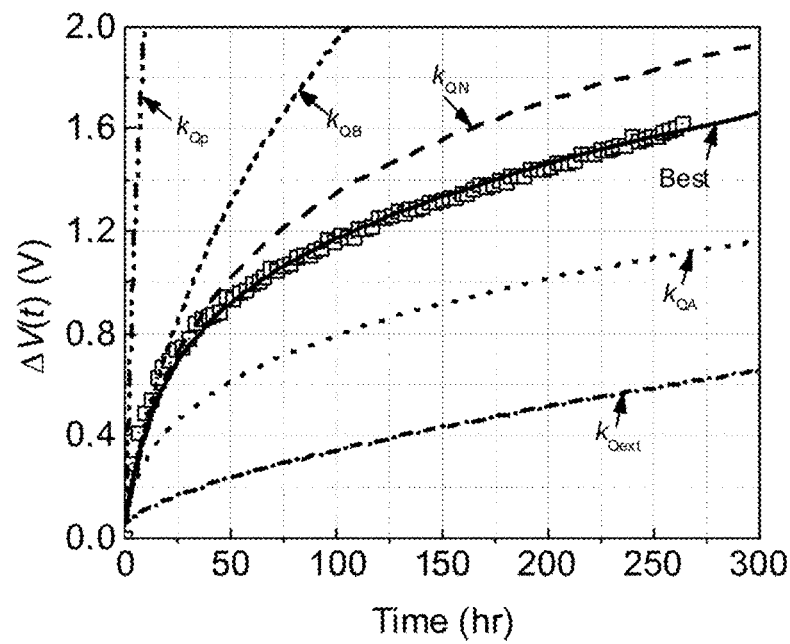

FIGS. 13D and 13E show the sensitivity of the fitting parameters for the lifetime model using change in defect generation rates $k_{QN}$, $k_{QA}$, $k_{QB}$, $k_{QP}$ and $k_{Qext}$. The legend provided in FIG. 13D applies to both FIGS. 13D and 13E. From the calculated set of parameters (yielding the black solid line, denoted as Best), the single parameter is modified by an order of magnitude within the bounds for the fit, while the other parameters are fixed. The results show that the change in the defect generation rates $k_{QN}$, $k_{QA}$, $k_{QB}$ and $k_{QP}$ make the models to significantly deviate from the data. As shown in FIG. 13D, change in $k_{Qext}$ does not affect L(t)/L$_0$ whereas it influences ΔV(t) to a large extent, consistent with the data shown in FIGS. 13B and 13C.

Figure 13F:
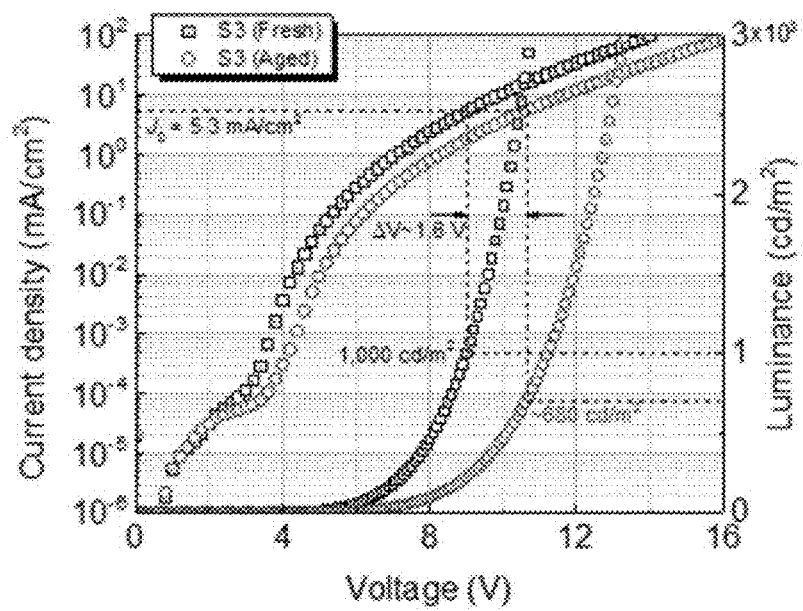
FIGS. 13F and 13G show the J-V-L and EQE-J characteristics of as-grown and aged managed PHOLEDs S3.
Figure 13G:
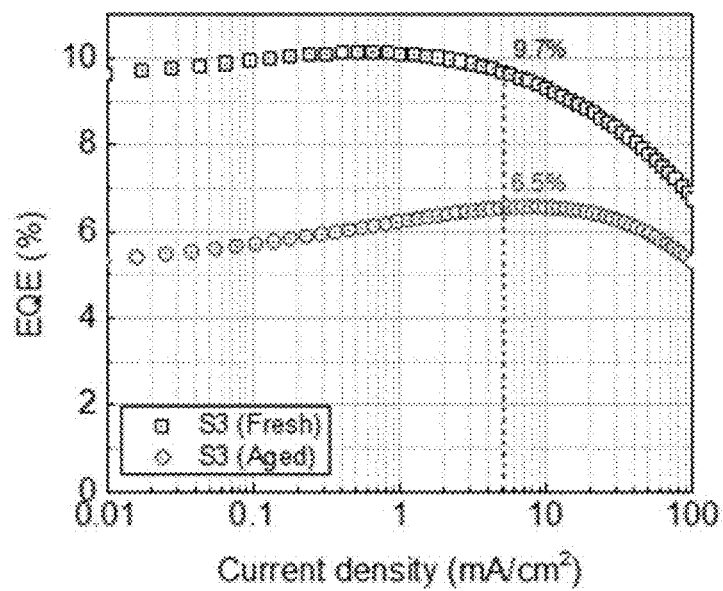

FIGS. 13F and 13G shows the J-V-L and EQE-J characteristics, respectively, of as-grown (fresh) and aged managed PHOLEDs S3. The aged S3 was driven by the constant $J_0=5.29$ mA/cm$^2$ for ~550 hours by which its initial luminance of $L_0=1,000$ cd/m$^2$ decrease by 32%. The device performance for both types are summarized in the Table 3.

TABLE 3

EL characteristics of fresh and aged PHOLED S3.

| Device | $J_0$ (mA/cm$^2$) | t (hr) | CIE* | V(t) (V) | EQE(t) (%) | L(t) (cd/m$^2$) |
|---|---|---|---|---|---|---|
| S3 (Fresh) | 5.29 | 0 | (0.16, 0.30) | 9.0 | 9.7 | 1,000 |
| S3 (Aged) | 5.29 | ~550 | (0.16, 0.30) | 10.6 | 6.5 | ~680 |

*Measured at J = 5 mA/cm$^2$.

J-V characteristics of aged S3 compared to that of fresh one shows both parallel translation towards the higher voltage region and the slight decrease in the slope. These trends are indicative of the existence of the traps and the resulting, reduced "effective" mobilities of the materials comprising the devices. For the simplicity of the model, the extrinsic factors such as degradation of the electrodes are not considered. In the EQE-J characteristics, reduced EQE attributes to the nonradiative recombination by the defects at low J and the exciton quenching at higher J.

Figure 13H:
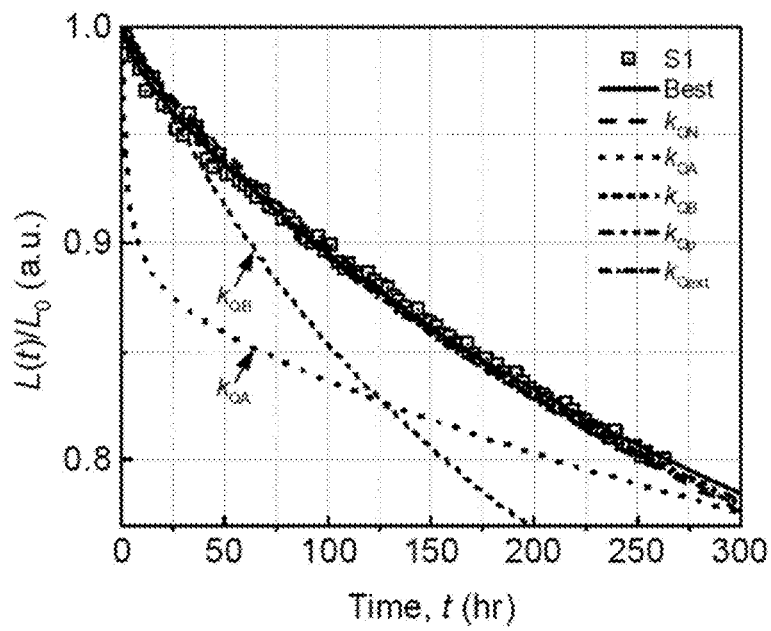
FIGS. 13H and 13I show the lifetime model fit for the defect generation rates $k_{QN}$, $k_{QA}$, $k_{QB}$, $k_{QP}$ and $k_{Qext}$ where a single parameter was forced to be smaller or larger by an order of magnitude relative to its final value, and the induced discrepancy in the fit was attempted to be compensated by varying the remaining four parameters.
Figure 13I:
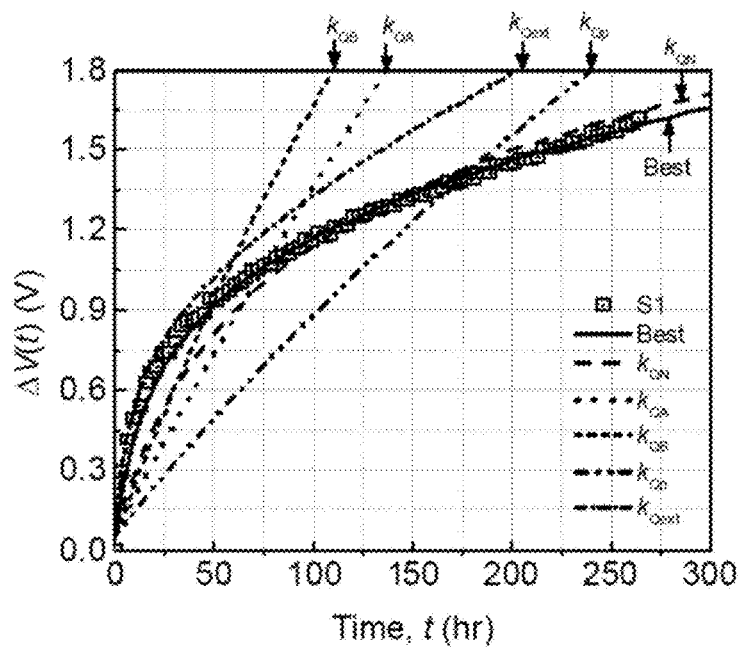

Referring to the model fit data shown in FIGS. 13H and 13I, we also forced one of the parameters $k_{QN}$, $k_{QA}$, $k_{QB}$, $k_{QP}$ and $k_{Qext}$ to be smaller or larger by an order of magnitude relative to its final value, and the induced discrepancy in the fit was attempted to be compensated by varying the remaining four parameters. FIGS. 13H and 13I show that all the resulting simulations cannot fit the voltage rise data, while some of those with changed $k_{QN}$, $k_{Qp}$ and $k_{Qext}$ are in a reasonable agreement with the luminance degradation data. However, considering that these fitting parameters are derived from coupled equations that should predict both the lifetime and voltage characteristics, the models that satisfy only one of these two characteristics are not accepted. This supports the validity of the lifetime model.

Supplemental Information S4: Lifetime of Reported Sky-Blue and Cyan PHOLEDs

According to another aspect of the present disclosure, the OLED can be incorporated into one or more of a consumer product, an electronic component module, and a lighting panel.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the possible materials include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as MoO$_x$; a p-type semiconducting organic compound, such as 1,4,5,8,9,12-Hexaazatriphenylenehexacarbonitrile; a metal complex, and a cross-linkable compounds.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the

| Dopant | †$J_0$ (mA/cm$^2$) | EQE (%) | Luminance (cd/m$^2$) | †$V_0$ (V) | CIE | $\lambda_{onset}/\lambda_{peak}$ (nm) | †$L_0$ (cd/m$^2$) | Lifetime (hr) |
|---|---|---|---|---|---|---|---|---|
| Ir(dmp)$_3$ | 5.3 | 9.6 ± 0.0 | 1,000 | 9.0 ± 0.1 | (0.16, 0.30) | 440/462 | 1,000 | 334 ± 5 (T80) |
| Ir(dbi)$_3$ | N/A | 24.3/23.0 | Max/1,000 | ~6.2 | (0.19, 0.44) | 440/475 | 1,000 | 15 (T80) |
| Ir(dbi)$_3$ | ~5 | 7 | 1,000 | ~8.5 | (0.19, 0.44) | 440/475 | 1,000 | 7 (T80) |
| Ir(iprpmi)$_3$ | N/A | 19.9/19.6 | Max/1,000 | 7.82 | (0.17, 0.40) | 450/474 | 1,000 | ~20 (T80) |
| Ir(dbi)$_3$ | ~6 | ~14/~11 | Max/1,000 | 10 | (0.19, 0.44) | 440/475 | 500 | ~60 (T80) |
| FIrpic & Pyrene-CN | 60.1 | ~2.5 | 1,000 | ~8 | (0.15, 0.13) | 430/455 | 500 | ~1 (T80) |
| FIrpic | ~5 | 13.5/12.6 | Max/1,000 | 7.4 | (0.16, 0.36) | 435/467 | 1,000 | 0.1 (T50) |
| Ir(dbi)$_3$ | ~3 | 23.1/20.1 | Max/1,000 | 5.6 | (0.19, 0.44) | 440/475 | 1,000 | 5.8 (T50) |
| Ir(ipripmi) | N/A | ~14 | Max | N/A | (0.17, 0.37) | 450/474 | 5 mA/cm$^2$ | 30 (T70) |
| PtNON | ~12 | 10.7/9.1 | Max/1,000 | ~13 | (0.17, 0.32) | 420/476 | 1,000 | *335 (T80) |
| Ir(dbi)$_3$ | N/A | ~8/4 | Max/1,000 | 9.25 | (0.19, 0.44) | 440/475 | 1,000 | 154 (T80) |
| Ir(dmp)$_3$ | N/A | N/A | N/A | N/A | (0.15, 0.25) | 440 462 | 15 mA/cm$^2$ | 225 (T50) |

†$J_0$, $V_0$, and $L_0$ are the operating current density, initial voltage, and luminance, respectively, for the lifetime test.

*Extrapolated using the relation, T(1,000 cd/m$^2$) = T($L_0$) × ($L_0$/1,000).

vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.
Additional Hosts:

The light emitting layer of the organic EL device of the present invention preferably contains at least a light emitting dopant material, and may contain one or more additional host materials. Examples of the host material are not particularly limited, and many metal complexes or organic compounds may be used as long as the triplet energy of the host is larger than that of the emitting dopant. Any host material may be used with any dopant so long as the triplet criteria is satisfied.

Emitter:

An emitter example is not particularly limited, and any compound may be used as long as the compound is typically used as an emitter material. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light emitting device comprising:
   an anode;
   a cathode; and
   an organic layer, disposed between the anode and the cathode, comprising a emissive layer, wherein the emissive layer comprises a host, a first dopant, and a second dopant;
   wherein the first dopant is a phosphorescent emitter dopant that emits light of wavelength less than 500 nm, and the second dopant is an excited energy state managing dopant;
   wherein the second dopant comprises between 2-10 vol. % of the emissive layer, and the second dopant has a lowest triplet state energy level greater than 2.9 eV, which is greater than lowest triplet state energy levels of both the host and the first dopant, and less than the multiply-excited energy level of the first dopant.

2. The organic light emitting device of claim 1, wherein the second dopant comprises less than or equal to 3 vol. % of the emissive layer.

3. The organic light emitting device of claim 1, wherein the second dopant is located in a zone in the emissive layer that has the highest exciton density within the emissive layer.

4. The organic light emitting device of claim 1, further comprising:
   a hole transporting layer (HTL) provided between the emissive layer (EML) and the anode and in direct contact with the EML and forming an HTL/EML interface; and
   an electron transporting layer (ETL) provided between the EML and the cathode and in direct contact with the EML and forming an ETL/EML interface;
   wherein the first dopant is present in the emissive layer in a linearly graded concentration level that is at the highest concentration level at the HTL/EML interface and the lowest concentration level at the ETL/EML interface.

5. The organic light emitting device of claim 1, wherein the second dopant is selected from the group consisting of.

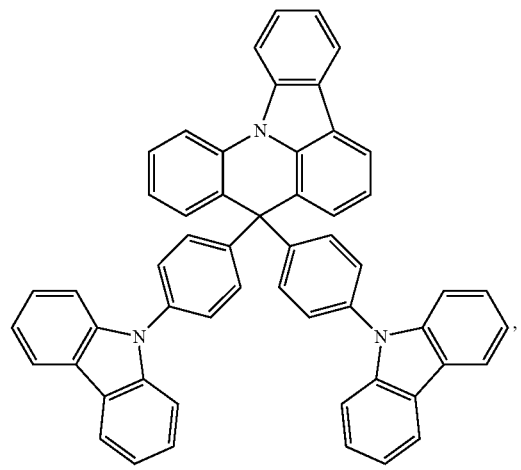

FPCC

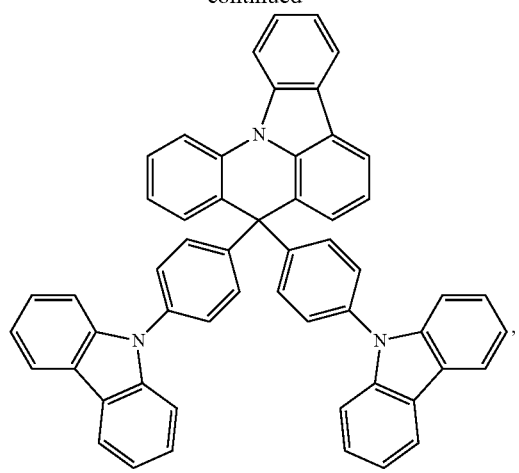
FPCA
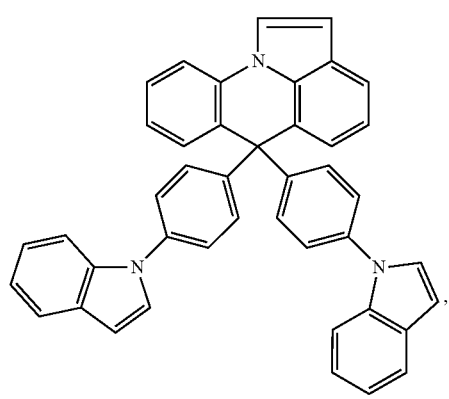
BIPPA
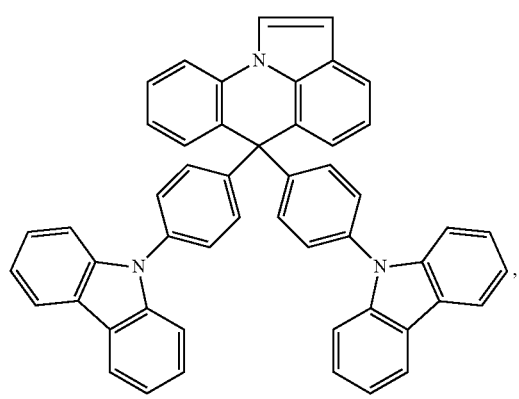
BCPPA
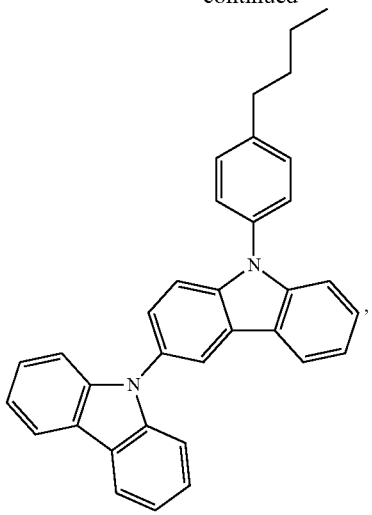
BCz2
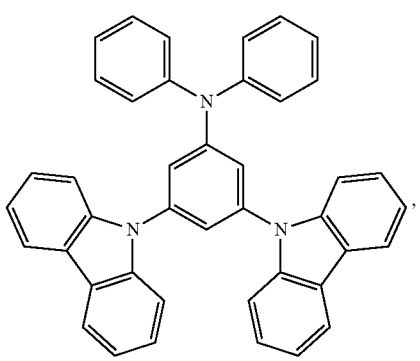
DCDPA
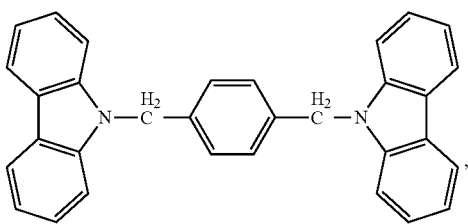
TCz2
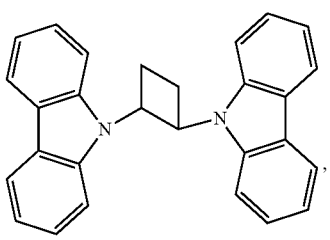
DCB -continued

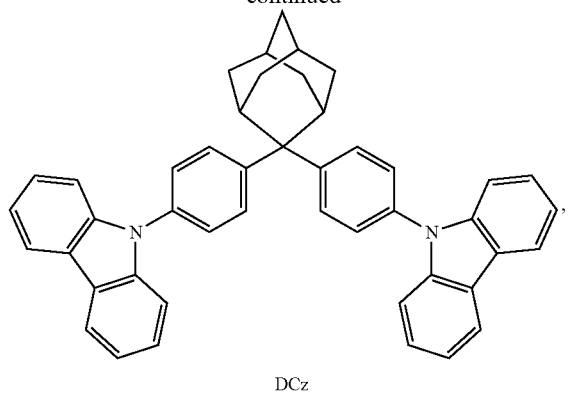
DCz

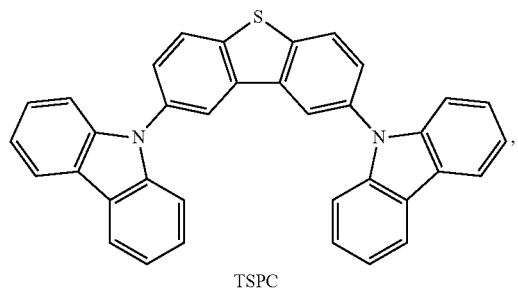
TSPC

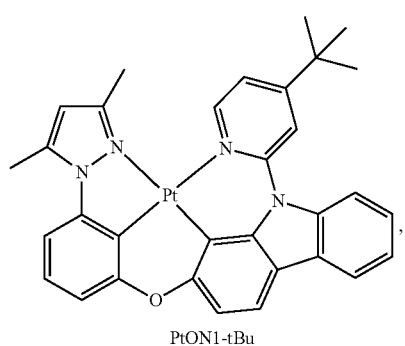
PtON1-tBu

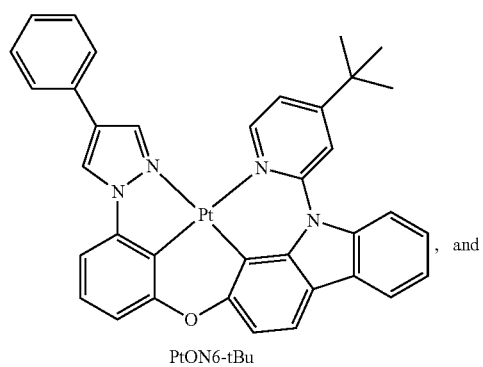
PtON6-tBu, and

-continued

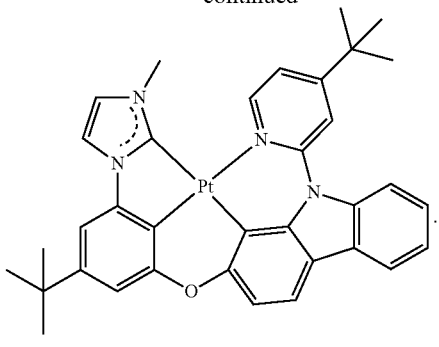
PtON7-dtb

6. The organic light emitting device of claim 1, wherein the organic layer further comprises a blocking layer.

7. The first organic light emitting device of claim 1, wherein the organic layer further comprises a charge transport layer.

8. The organic light emitting device of claim 1, wherein the first organic light emitting device is incorporated into a device selected from the group consisting of a consumer product, an electronic component module, an organic light-emitting device, and a lighting panel.

9. The organic light emitting device of claim 1, wherein the second dopant enables rapid exothermic energy transfer from the multiply-excited energy level of the first dopant to the second dopant to minimize direct dissociative reactions in the emissive layer.

10. The organic light emitting device of claim 1, wherein the second dopant does not emit light.

11. An organic light emitting device comprising:
    an anode;
    a cathode; and
    an organic layer, disposed between the anode and the cathode, comprising a emissive layer, wherein the emissive layer comprises a host, a first dopant, and a second dopant;
        wherein the first dopant is a thermally activated delayed fluorescent emitter that emits light of wavelength less than 500 nm, and the second dopant is an excited energy state managing dopant;
        wherein the second dopant comprises between 2-10 vol. % of the emissive layer, and the second dopant has a lowest triplet state energy level greater than 2.9 eV, which is greater than lowest triplet state energy levels of both the host and the first dopant and less than the multiply-excited energy level of the first dopant.

12. The organic light emitting device of claim 11, wherein the second dopant comprises less than or equal to 6 vol. % of the emissive layer.

13. The organic light emitting device of claim 11, wherein the second dopant comprises less than or equal to 3 vol. % of the emissive layer.

14. The organic light emitting device of claim 11, wherein the second dopant is located in a zone in the emissive layer that has the highest exciton density within the emissive layer.

15. The organic light emitting device of claim 11, further comprising:
    a hole transporting layer (HTL) provided between the emissive layer (EML) and the anode and in direct contact with the EML and forming an HTL/EML interface; and an electron transporting layer (ETL) provided between the EML and the cathode and in direct contact with the EML and forming an ETL/EML interface;

wherein the first dopant is present in the emissive layer in a linearly graded concentration level that is at the highest concentration level at the HTL/EML interface and the lowest concentration level at the ETL/EML interface.

16. The organic light emitting device of claim 11, wherein the second dopant is selected from the group consisting of:

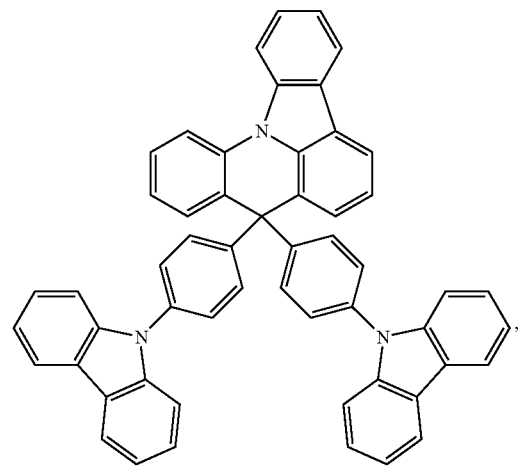

FPCC

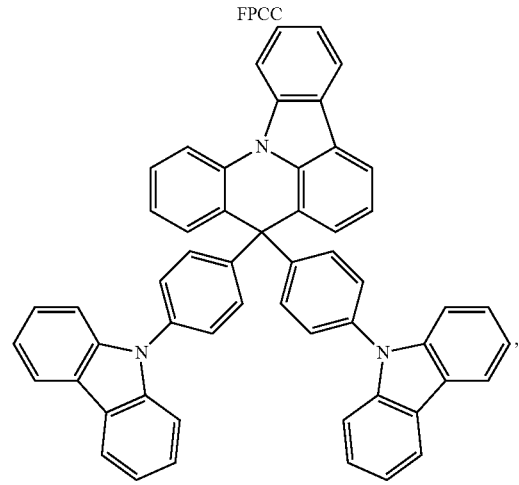

FPCA

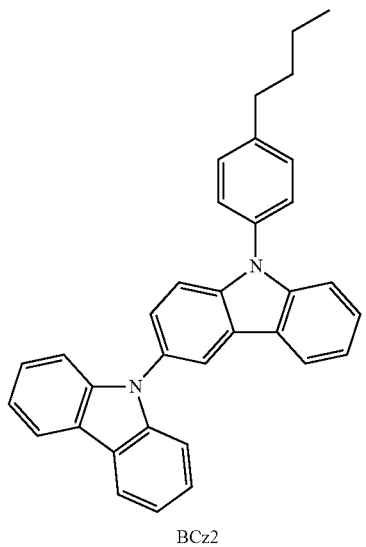

BIPPA

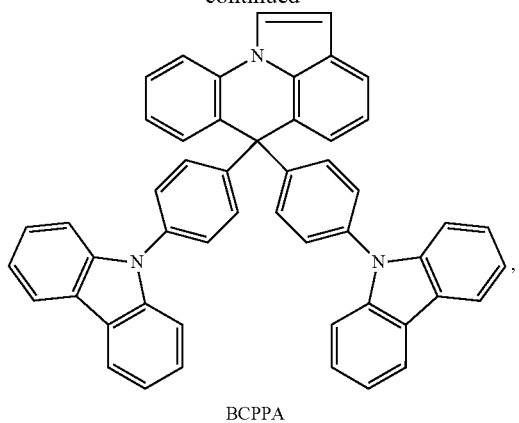

BCPPA

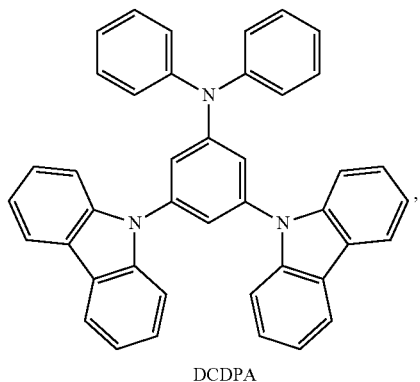

BCz2

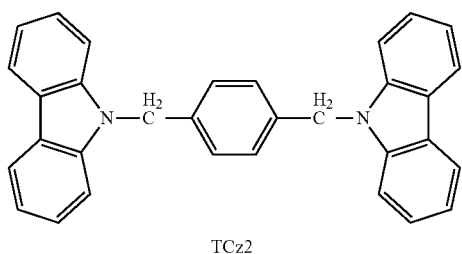

DCDPA

TCz2

-continued

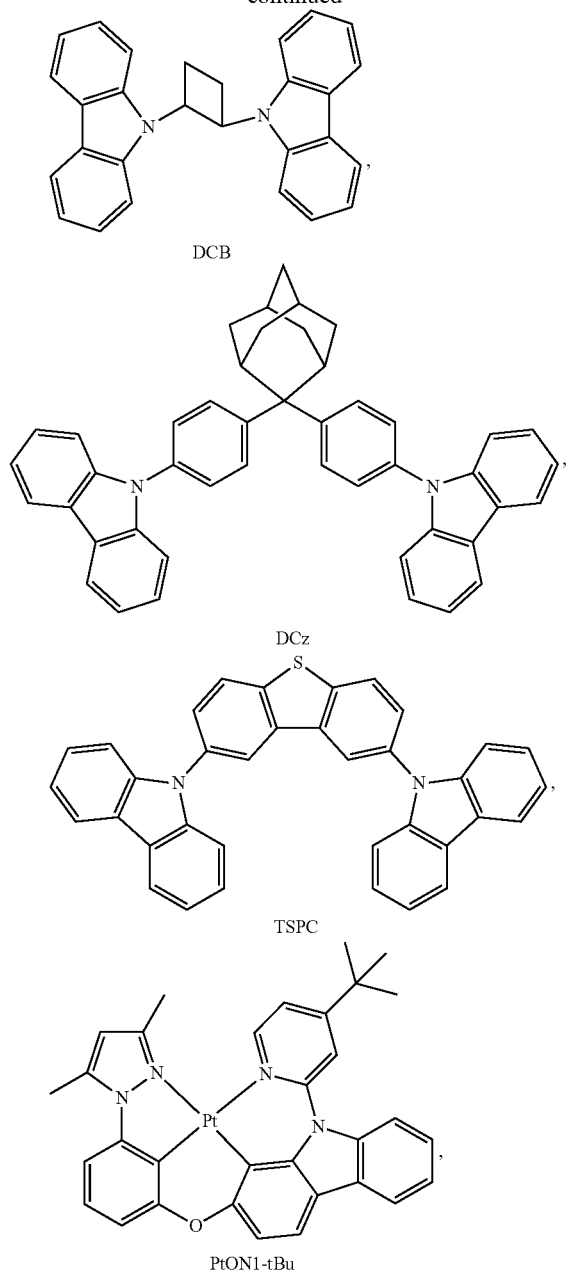

-continued

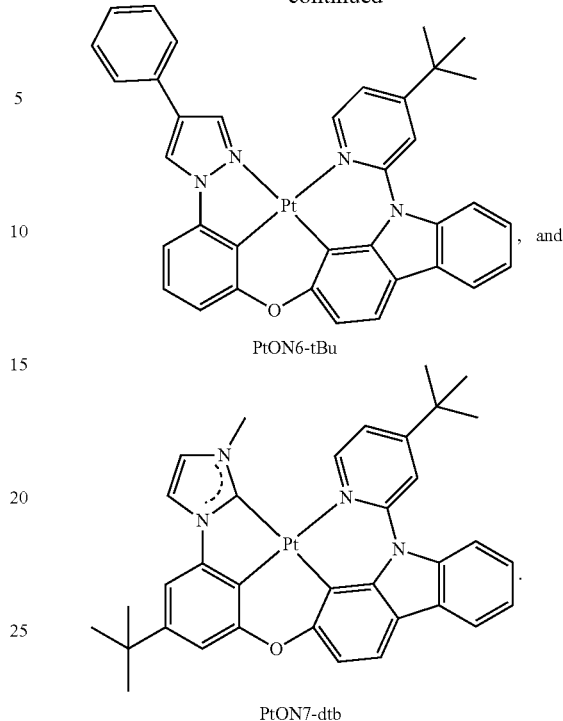

17. The organic light emitting device of claim 11, wherein the organic layer further comprises a blocking layer.

18. The first organic light emitting device of claim 11, wherein the organic layer further comprises a charge transport layer.

19. The organic light emitting device of claim 11, wherein the first organic light emitting device is incorporated into a device selected from the group consisting of a consumer product, an electronic component module, an organic light-emitting device, and a lighting panel.

20. The organic light emitting device of claim 11, wherein the second dopant enables rapid exothermic energy transfer from the multiply-excited energy level of the first dopant to the second dopant to minimize direct dissociative reactions in the emissive layer.

21. The organic light emitting device of claim 11, wherein the second dopant does not emit light.

* * * * *